US011626565B2

(12) United States Patent
Park

(10) Patent No.: US 11,626,565 B2
(45) Date of Patent: Apr. 11, 2023

(54) DISPLAY DEVICE

(71) Applicant: Samsung Display Co., LTD., Yongin-si (KR)

(72) Inventor: Jae Chun Park, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 120 days.

(21) Appl. No.: 17/342,740

(22) Filed: Jun. 9, 2021

(65) Prior Publication Data
US 2021/0408412 A1 Dec. 30, 2021

(30) Foreign Application Priority Data

Jun. 29, 2020 (KR) .................... 10-2020-0078959

(51) Int. Cl.
H01L 51/00 (2006.01)
H01L 27/32 (2006.01)
B32B 7/12 (2006.01)
H01L 51/52 (2006.01)

(52) U.S. Cl.
CPC ............ *H01L 51/0097* (2013.01); *B32B 7/12* (2013.01); *H01L 27/323* (2013.01); *H01L 27/3244* (2013.01); *H01L 51/5237* (2013.01); *B32B 2457/20* (2013.01); *H01L 2251/5338* (2013.01)

(58) Field of Classification Search
None
See application file for complete search history.

(56) References Cited

U.S. PATENT DOCUMENTS

2015/0049428 A1 2/2015 Lee et al.
2021/0144871 A1* 5/2021 Araki ..................... G06F 1/1652
2021/0216106 A1* 7/2021 Soh ........................ G06F 1/1681

FOREIGN PATENT DOCUMENTS

KR 1020200006646 A 1/2020

* cited by examiner

*Primary Examiner* — J. E. Schoenholtz
(74) *Attorney, Agent, or Firm* — Cantor Colburn LLP

(57) ABSTRACT

A display device includes a display panel including first and second unfolding areas, and a folding area therebetween, a first support member and a second support member disposed on a back surface of the display panel and spaced apart from each other with the folding area therebetween, a first barrier sheet partially fixed to a back surface of the first support member and extending to a back surface of the second support member, and a second barrier sheet partially fixed to the back surface of the second support member, extending to the back surface of the first support member, and covering the first barrier sheet. Each of the first barrier sheet and the second barrier sheet overlaps the first support member, the folding area, and the second support member, and the first barrier sheet is accommodated in a space between the second barrier sheet and the second support member.

20 Claims, 24 Drawing Sheets

DISPLAY DEVICE

This application claims priority to Korean Patent Application No. 10-2020-0078959, filed on Jun. 29, 2020, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

Electronic appliances such as smart phones, tablet PCs, digital cameras, notebook computers, navigators, and smart televisions, which provide images to users, includes a display device for displaying images.

A foldable display device has attracted considerable attention. The foldable display device has both advantages of a smart phone and advantages of a tablet PC because it is portable and has a wide screen.

A gap may be formed between members forming an exterior or interior of the foldable display device. When foreign matter flows into the lower portion of a display panel through such a gap, defects such as wrinkles may occur in the display panel.

SUMMARY

An aspect of the present disclosure is to provide a display device capable of preventing foreign matter from being introduced into a gap between members of the display device.

Another aspect of the present disclosure is to provide a method of manufacturing a display device in which damages due to heat generated in a laser cutting process may be minimized.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device includes: a display panel including a folding area, a first unfolding area and a second unfolding area, wherein the first and second unfolding areas are adjacent to each other with the folding area therebetween and arranged in a first direction in a plan view in an unfolding state of the display device; a first support member and a second support member disposed on a back surface of the display panel and spaced apart from each other with the folding area therebetween; a first barrier sheet at least partially fixed to a back surface of the first support member and extending to a back surface of the second support member; and a second barrier sheet at least partially fixed to the back surface of the second support member, extending to the back surface of the first support member, and covering the first barrier sheet Each of the first barrier sheet and the second barrier sheet overlaps the first support member, the folding area, and the second support member in the plan view in the unfolding state, and the first barrier sheet is accommodated in a space between the second barrier sheet and the second support member.

In an exemplary embodiment, the first support member may overlap the first unfolding area, and the second support member may overlap the second unfolding area.

In an exemplary embodiment, the display device may further include a first adhesive member disposed between the first support member and the first barrier sheet, and second adhesive members disposed between the second support member and the second barrier sheet, where the first adhesive member is disposed on a front surface of the first barrier sheet to attach the first support member and the first barrier sheet, and the second adhesive members are disposed on at least both corners of the second barrier sheet to attach the second support member and the second barrier sheet.

In an exemplary embodiment, the second adhesive member may be thicker than the first adhesive member in a thickness direction different from the first direction.

In an exemplary embodiment, the second barrier sheet may overlap entirety of the first barrier sheet in the plan view in the unfolding state, and the first barrier sheet may be disposed in a space between the first support member and the second barrier sheet and between the second support member and the second barrier sheet.

In an exemplary embodiment, the first barrier sheet may include a first barrier area overlapping the first support member, the folding area, and the second support member, and a second barrier area overlapping the second support member and not overlapping the first support member and the folding area in the plan view in the unfolding state.

In an exemplary embodiment, a width of the first barrier area may be greater than a width of the second barrier area in a second direction crossing the first direction, and the second barrier area may be disposed between second adhesive members.

In an exemplary embodiment, the second barrier sheet may cover and overlap entirety of the first barrier sheet, and have a greater planar area than the first barrier sheet in the plan view in the unfolding state.

In an exemplary embodiment, a maximum length of the second barrier sheet may be greater than or equal to a maximum length of the first barrier sheet in the first direction.

In an exemplary embodiment, the second barrier sheet may overlap a portion of the first barrier sheet, and not overlap a remaining portion of the first barrier sheet.

In an exemplary embodiment, the display device may further include: a third barrier sheet disposed in an area of a back surface of the first barrier sheet, not overlapping the second barrier sheet, and spaced apart from the second barrier sheet in the plan view in the unfolding state, where the third barrier sheet and the second barrier sheet may be disposed on the same plane.

In an exemplary embodiment, the third barrier sheet may be attached to the back surface of the first barrier sheet through a third adhesive member disposed in an area of the back surface of the first barrier sheet, not overlapping the second barrier sheet in the plan view in the unfolding state.

In an exemplary embodiment, a gap between the third barrier sheet and the second barrier sheet may not overlap the folding area in the plan view in the unfolding state.

In an exemplary embodiment, the gap between the third barrier sheet and the second barrier sheet may overlap the first support member, and not overlap the second support member in the plan view in the unfolding state.

In an exemplary embodiment, one side of the first support member and one side of the second support member, which are adjacent to the folding area, may face each other and have a hemming structure.

In an exemplary embodiment, the display device may further include: a connection unit disposed behind the second barrier sheet, where the connection unit may include a first hinge bracket overlapping the first support member, a second hinge bracket overlapping the second support member, and a hinge structure coupling the first hinge bracket and the second hinge bracket, and the hinge structure may overlap the first barrier sheet and the second barrier sheet in the plan view in the unfolding state.

According to an embodiment of the present disclosure, a display device, includes: a display panel including a folding area, a first unfolding area and a second unfolding area, wherein the first and second unfolding areas are adjacent to each other with the folding area therebetween; a first support member and a second support member disposed on a back surface of the display panel and spaced apart from each other with the folding area therebetween; a first adhesive member disposed on a back surface of the first support member and a second adhesive member disposed on a back surface of the second support member; a first barrier sheet at least partially fixed to the first adhesive member and extending to the back surface of the second support member; and a second barrier sheet at least partially fixed to the second adhesive member, extending to the back surface of the first support member, and covering the first barrier sheet, wherein the first barrier sheet and the second barrier sheet overlap a gap between the first support member and the second support member, and the first barrier sheet is disposed between the second barrier sheet and the second support member and between the second barrier sheet and the first support member.

In an exemplary embodiment, the display device may further include: a hinge structure disposed behind the second barrier sheet. When the display device is folded, the first barrier sheet and the second barrier sheet may be bent according to a shape of an upper surface of the hinge structure.

In an exemplary embodiment, the upper surface of the hinge structure and the second barrier sheet may at least partially contact each other, and the first barrier sheet and at least a portion of the second barrier sheet may contact each other.

In an exemplary embodiment, one side of the first support member may face one side of the second adhesive member, and a length between one side of the first barrier sheet and one side of the second adhesive member in an unfolding state of the display device may be shorter than and a length between one side of the first barrier sheet and one side of the second adhesive member in a folding state of the display device.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
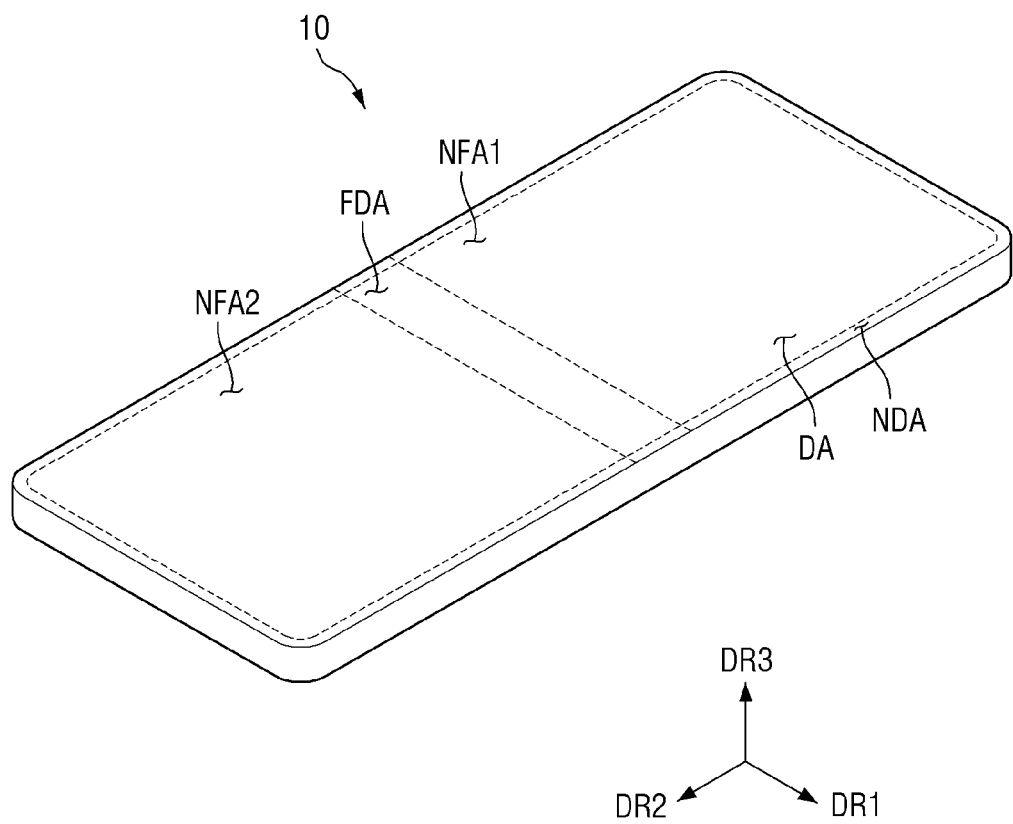
FIG. 1 is a perspective view illustrating an unfolded state of a display device according to an embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the attached drawings.

Figure 2:
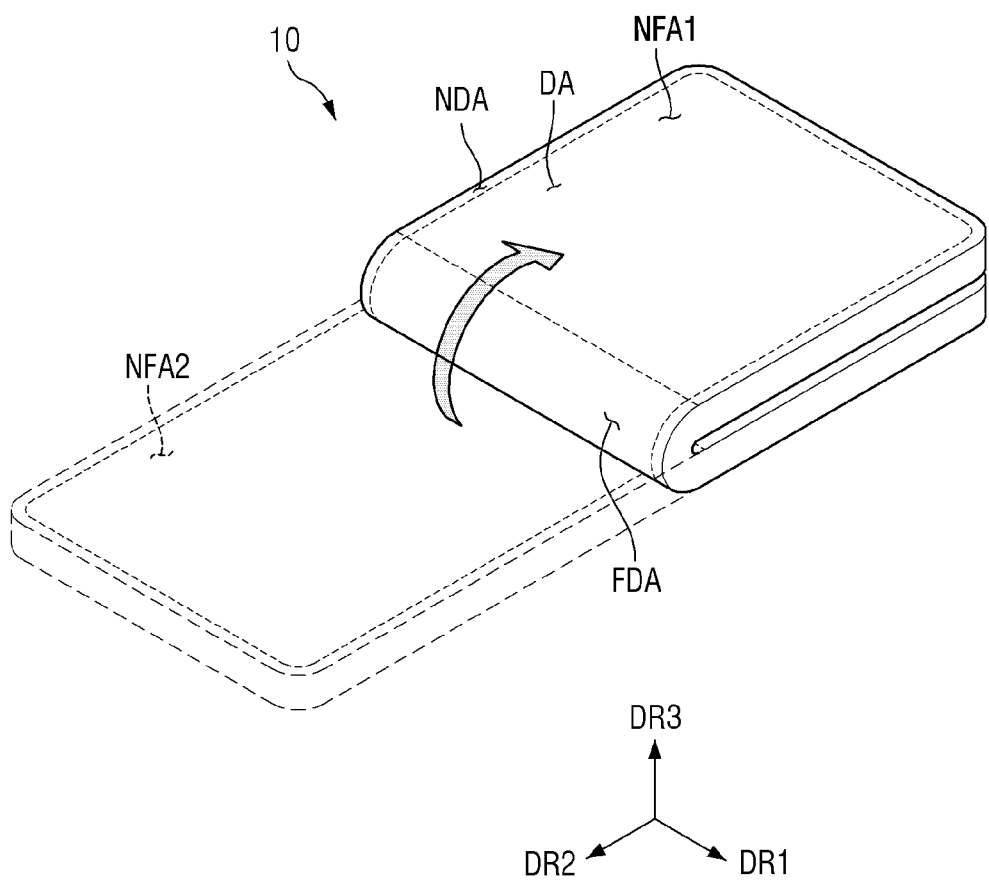
FIG. 2 is a perspective view illustrating a folded state of a display device according to an embodiment.
Figure 3:
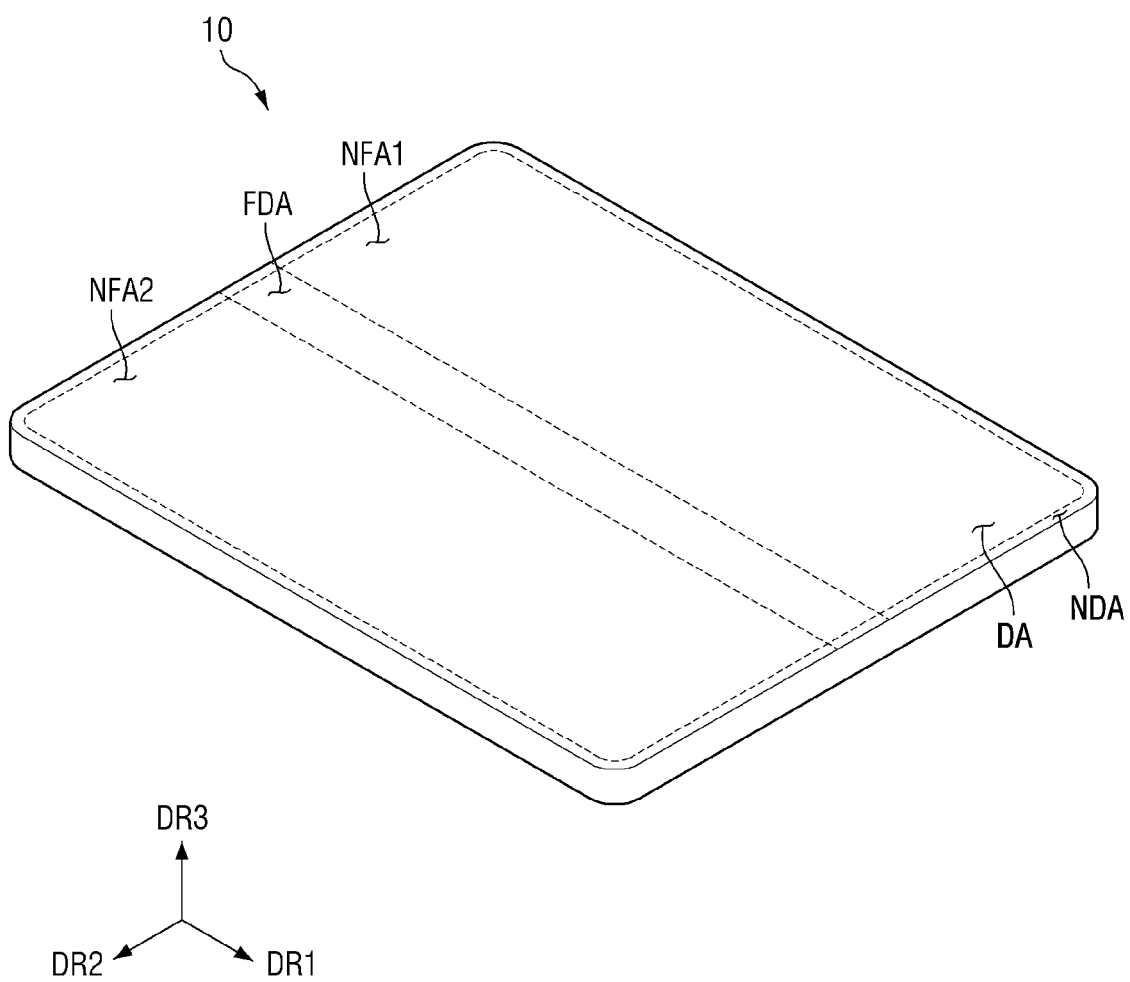
FIG. 3 is a perspective view illustrating an unfolded state of a display device according to another embodiment.
Figure 4:
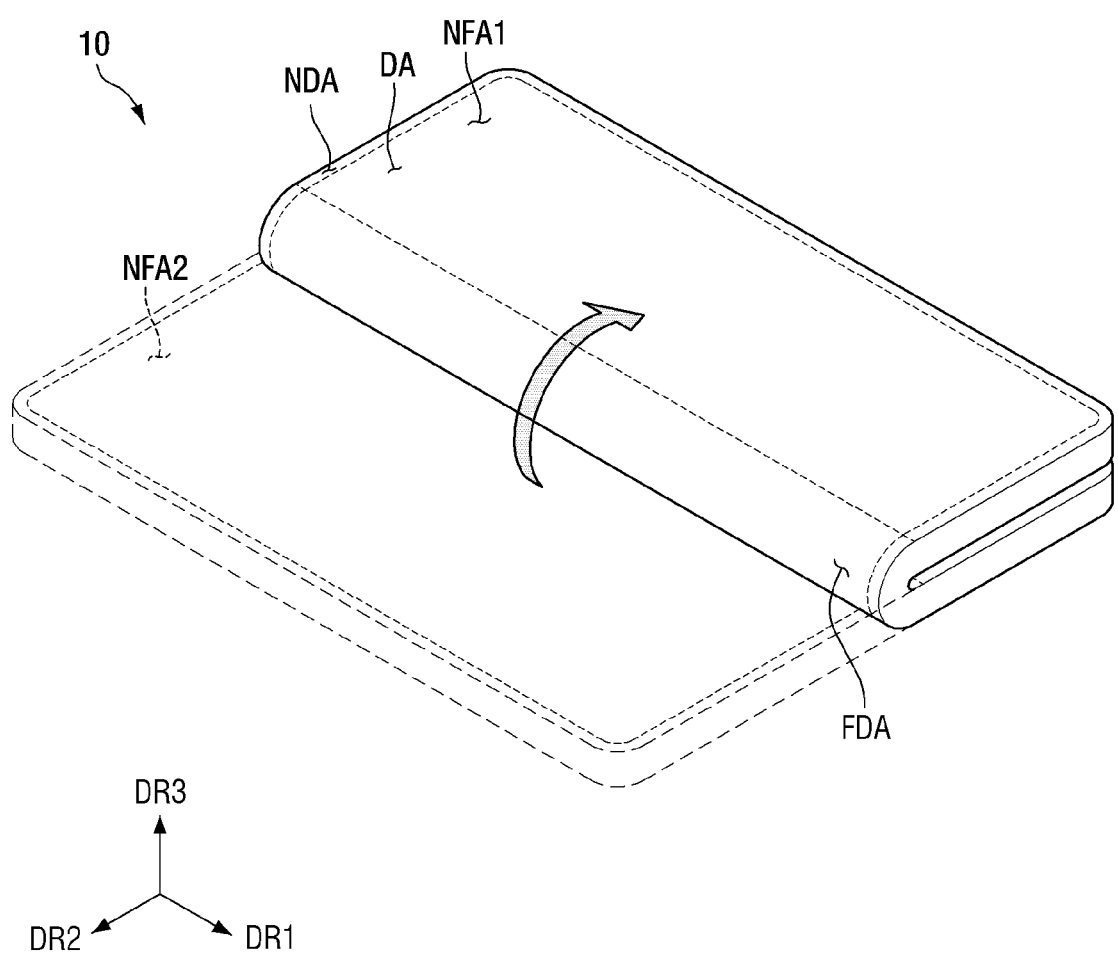
FIG. 4 is a perspective view illustrating a folded state of a display device according to another embodiment.

FIG. 1 is a perspective view illustrating an unfolded state of a display device according to an embodiment, FIG. 2 is a perspective view illustrating a folded state of a display device according to an embodiment, FIG. 3 is a perspective view illustrating an unfolded state of a display device according to another embodiment, and FIG. 4 is a perspective view illustrating a folded state of a display device according to another embodiment.

Referring to FIG. 1, a display device 10 according to an embodiment is a foldable display device. Although the display device 10 will be mainly described with reference to smart phones, the present disclosure is not limited thereto. For example, the display device 10 according to embodiments of the present specification may be applied to portable phones, tablet PCs, personal digital assistants ("PDAs"), portable multimedia players ("PMPs"), televisions, game machines, wrist-watch type electronic devices, head mount displays, monitors of personal computers, notebook computers, car navigators, car dashboards, digital cameras, camcorders, billboards, medical devices, inspection devices, various home appliances such as refrigerators and washing machines, and internet of thing devices, in addition to smart phones.

In FIGS. 1 and 2, the first direction DR1 may be a direction parallel to one side of the display device 10 when viewed on a plane (i.e., plan view), and, for example, may be a vertical direction of the display device 10. The second direction DR2 may be a direction parallel to the other side of the display device contacting the one side of the display device 10 when viewed on the plane, and for example, may be a horizontal direction of the display device 10. The third direction DR3 may be a thickness direction (i.e., the third direction DR3) of the display device 10. A folding axis is in the first direction DR1.

In an embodiment, the display device 10 may have a rectangular shape when viewed on the plane (i.e., plan view). The display device 10 may have a rectangular shape where corners are straight or a substantially rectangular shape where corners are round when viewed on the plane. The display device 10 may include two short sides arranged in the first direction DR1 and two long sides arranged in the second direction DR2 when viewed on the plane.

The display device 10 may include a display area DA and a non-display area NDA. When viewed on the plane (i.e., plan view), the shape of the display area DA may correspond to the shape of the display device 10. For example, when the display device 10 has a rectangular shape when viewed on the plane, the display area DA may also have rectangular shape.

The display area DA may be an area where a plurality of pixels is provided to display an image. The plurality of pixels may be arranged in a matrix form. Each of the plurality of pixels may have a rectangular shape, a rhombus shape, or a square shape when viewed on the plane (i.e., plan view), but the shape thereof according to the invention is not limited thereto. For example, each of the plurality of pixels may have a polygonal shape, a circular shape, or an elliptic shape in addition to the rectangular shape, the rhombus shape, or the square shape when viewed on the plane in another embodiment.

The non-display area NDA may be an area where no pixel is provided not to display an image. The non-display area NDA may be disposed around the display area DA. The non-display area NDA may be disposed to surround the display area DA as shown in FIG. 1, but the present disclosure according to the invention is not limited thereto. The display area DA may be partially surrounded by the non-display area NDA in another embodiment.

In an embodiment, the display device 10 may maintain both a folded state and an unfolded state. As shown in FIG. 2, the display device 10 may be folded in an in-folding manner in which the display area DA is disposed inside. When the display device 10 is folded in an in-folding manner, the upper surfaces of the display device 10 may be disposed to face each other. As another example, the display device 10 may be folded in an out-folding manner in which the display area DA is disposed outside. When the display device 10 is folded in an out-folding manner, the lower surfaces of the display devices 10 may be disposed to face each other.

In an embodiment, the display device 10 may be a foldable device. As used herein, a foldable device is a device capable of being folded, and refers to a device capable of having both a folded state and an unfolded state as well as a folded device. Further, folding typically refers to a case where the display device 10 is folded at an angle of about 180 degrees (°), but the present disclosure according to the invention is not limited thereto, and may refer to a case where the display device 10 is folded at an angle of less than 180° or a case where the display device 10 is folded at an angle of 90° or more and less than 180° or 120° or more and less than 180° in another embodiment. Moreover, the folded state may be referred to as a folded state when the display device 10 is folded out of an unfolding state, even if complete folding is not performed. For example, even if the display device 10 is folded at an angle of 90° or less, as long as the maximum folding angle is 90° or more, it may be expressed that the display device 10 is in the folded state to be distinguished from the unfolded state. The curvature radius during folding may be about 5 millimeters (mm) or less, preferably, about 1 mm to about 2 mm or about 1.5 mm, but the curvature radius according to the invention is not limited thereto.

In an embodiment, the display device 10 may include a folding area FDA, a first non-folding area NFA1, and a second non-folding area NFA2. The folding area FDA is an area where the display device 10 is foldable. The first non-folding area NFA1 and the second non-folding area NFA2 may be areas where the display device 10 is not foldable.

The first non-folding area NFA1 may be disposed at one side of the folding area FDA, for example, at the upper side thereof. The second non-folding area NFA2 may be disposed at the other side of the folding area FDA, for example, at the lower side thereof. The folding area FDA may be an area bendable at a predetermined curvature.

In an embodiment, the folding area FDA of the display device 10 may be fixed at a specific location. In the display device 10, one folding area FDA or two or more folding areas FDA may be disposed at a specific location. In another embodiment, the location of the folding area FDA is not specified in the display device 10, and may be freely set in various areas.

In an embodiment, the display device 10 may be folded in the second direction DR2. Thus, the length of the display device 10 in the second direction DR2 may be reduced to approximately half in the folded state compared to the unfolded state, so that the user may conveniently carry the display device 10.

The folding direction of the display device 10 is not limited to the second direction DR2. In another embodiment, for example, when the display device 10 is folded in the first direction DR1, the length of the display device 10 in the first direction DR1 may be reduced to approximately half in the folded state compared to the unfolded state.

Although it is illustrated in FIGS. 1 and 2 that each of the display area DA and the non-display area NDA overlaps the folding area FDA, the first non-folding area NFA1, and the second non-folding area NFA2 in the plan view, the present disclosure according to the invention is not limited thereto. For example, each of the display area DA and the non-display area NDA may overlap at least one of the folding area FDA, the first non-folding area NFA1, and the second non-folding area NFA2 in another embodiment.

Referring to FIGS. 3 and 4, in the display device 10 according to another embodiment, the first direction DR1 may be a direction parallel to one side of the display device 10 when viewed on a plane, (i.e., plan view) and for example, may be a vertical direction of the display device 10. The second direction DR2 may be a direction parallel to the other side of the display device contacting the one side of the display device 10 when viewed on the plane, and for example, may be a horizontal direction of the display device 10. The third direction DR3 may be a thickness direction (i.e., the third direction DR3) of the display device 10. The display device 10 may include two long sides disposed in the first direction DR1 and two short sides disposed in the second direction DR2 when viewed on a plane (i.e., plan view). A folding axis is in the second direction DR2.

In the present embodiment, as shown in FIG. 4, the display device 10 may be folded in an in-folding manner in which the display area DA is disposed inside, or may be folded in an out-folding manner in which the display area DA is disposed outside. The display device 10 may include a folding area FDA, a first non-folding area NFA1, and a second non-folding area NFA2. The folding area FDA may be an area bendable at a predetermined curvature. The display device 10 may be folded in the second direction DR2. Thus, the length of the display device 10 in the second direction DR2 may be reduced to approximately half in the folded state compared to the unfolded state, so that the user may conveniently carry the display device 10.

Figure 5:
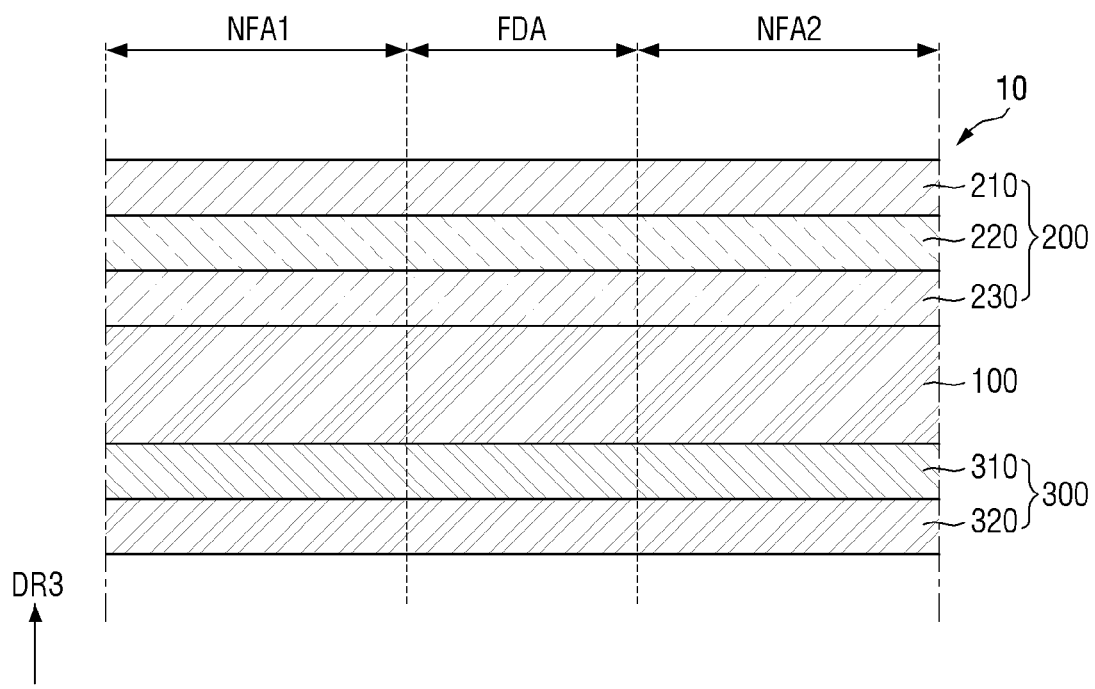
FIG. 5 is a cross-sectional view of an unfolded state of a display device according to an embodiment.
Figure 6:
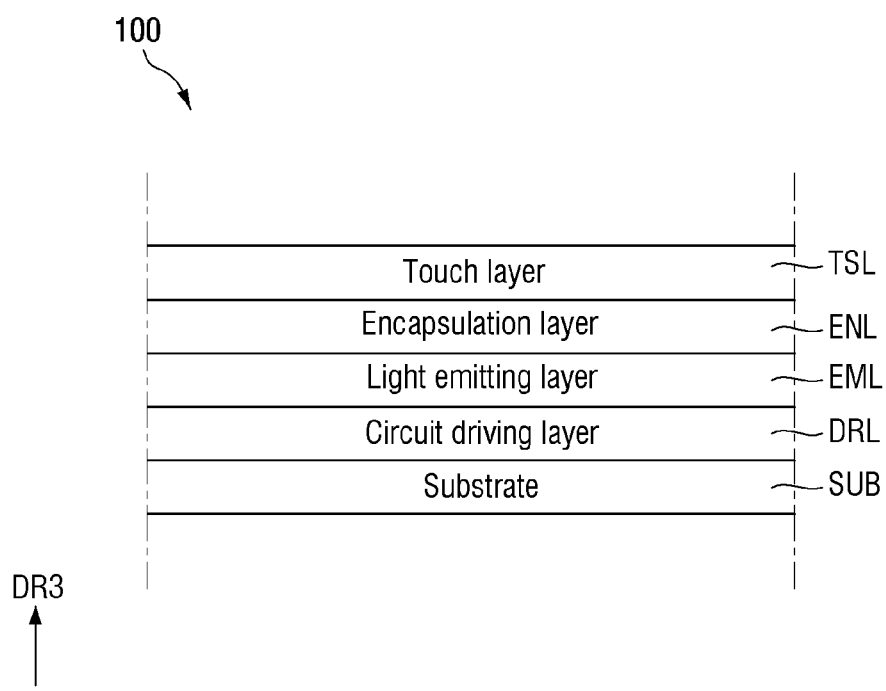
FIG. 6 is a cross-sectional view of a folded state of a display device according to an embodiment.

FIG. 5 is a cross-sectional view of an unfolded state of a display device according to an embodiment, and FIG. 6 is a schematic cross-sectional view of a display panel according to an embodiment.

Referring to FIG. 5, the display device 10 may include the display panel 100, a front laminate structure 200 laminated in front of the display panel 100, and a back laminate structure 300 laminated behind the display panel 100. Here, the front of the display panel 100 refers to a direction in which the display panel 100 displays an image, and the back of the display panel refers to a direction opposite to the front of the display panel 100. One surface of the display panel 100 is located in front of the display panel 100, and the other surface of the display panel 100 is located behind the display panel 100.

The display panel 100 is a panel for displaying a screen or an image, and examples thereof may include self-light emitting display panels such as an organic light emitting display panel ("OLED"), an inorganic light emitting display panel (inorganic "EL"), a quantum dot light emitting display panel ("QED"), a micro LED display panel ("micro-LED"), a nano LED display panel ("nano-LED"), a plasma display panel ("PDP"), a field emission display panel ("FED"), and a cathode ray display panel ("CRT"); and light-receiving display panels such as liquid crystal display panel ("LCD") and an electrophoretic display panel ("EPD"). Hereinafter, an organic light emitting display panel will be described as an example of the display panel 100, and unless otherwise specified, the organic light emitting display panel applied to the embodiment will be simply referred to as a display panel. However, embodiments according to the invention are not limited to the organic light emitting display panel, and other display panels listed above or known in the art may be applied within the scope of sharing the technical idea.

The display panel 100 may further include a touch member. The touch member may be provided as a separate panel or film from the display panel 100 and attached to the display panel 100, but may also be provided in the form of a touch layer inside the display panel 100. In the following embodiments, a case where the touch member is provided inside the display panel 100 and included in the display panel 100 is illustrated, but the invention is not limited thereto.

Referring to FIG. 6, the display panel 100 includes a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL.

The substrate SUB may be a flexible substrate including a flexible polymer material such as polyimide. Accordingly, the display panel 100 may be warped, bent, folded, or rolled. In some embodiments, the substrate SUB may include a plurality of sub-substrates overlapping in the thickness direction (i.e., the third direction DR3) with a barrier layer interposed therebetween. In this case, each of the sub-substrates may be a flexible substrate.

The circuit driving layer DRL may be disposed on the substrate SUB. The circuit driving layer DRL may include a circuit for driving the light emitting layer EML of a pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with a variety of luminance according to a driving signal transmitted from the circuit driving layer DRL.

The encapsulation layer ENL may be disposed on the light emitting layer EML. The encapsulation layer ENL may include an inorganic film or a laminated film of an inorganic film and an organic film.

The touch layer TSL may be disposed on the encapsulation layer ENL. The touch layer TSL, which is a layer for recognizing a touch input, may function as a touch member. The touch layer TSL may include a plurality of sensing areas and a plurality of sensing electrodes.

Referring to FIG. 5 again, a front laminate structure 200 may be disposed in front of the display panel 100. The front laminate structure 200 may include a polarization member 230, a shock absorbing layer 220, and a cover window 210, which are sequentially laminated forward from the display panel 100.

The polarization member 230 polarizes light. The polarization member 230 may serve to reduce the reflection of external light. In an embodiment, the polarization member 230 may be a polarization film. The polarization film may include a polarization layer and a protective substrate sandwiching the polarization layer from the top and bottom thereof. The polarization layer may include polyvinyl alcohol. The polarization layer may be stretched in one direction. The stretching direction of the polarization layer may be an absorption axis, and the direction perpendicular thereto (e.g., the third direction DR3) may be a transmission axis. The protective substrate may be disposed on one surface and the other surface of the polarizing layer. The protective substrate may include or be made of a cellulose resin such as triacetyl cellulose, a polyester resin, or the like, but the material thereof according to the invention is not limited thereto.

The shock absorbing layer 220 may be disposed in front of the polarization member 230. The shock absorbing layer 220 may serve to protect a structure such as a display panel thereunder from an external shock. In an embodiment, the shock absorbing layer 220 may be a polymer film. The polymer film may include at least one of polyethylene terephthalate ("PET"), polyethylene naphthalate ("PEN"), polyether sulfone ("PES"), polyimide ("PI"), polyarylate ("PAR"), polycarbonate ("PC"), polymethyl methacrylate ("PMMA"), and cycloolefin copolymers.

The cover window 210 may be disposed in front of the shock absorbing layer 220. The cover window 210 serves to protect the display panel 100. The cover window 210 may include or be made of a transparent material. The cover window 210 may include or be made of, for example, glass or plastic.

When the cover window 210 includes glass, the glass may be ultra-thin glass ("UTG") or thin glass. When the glass is formed as an ultra-thin film or a thin film, it has flexible properties, and may thus be warped, bent, folded, or rolled. The thickness of the glass may be, for example, in the range of about 10 micrometers (μm) to about 300 μm, and specifically, glass having a thickness of about 10 μm to about 100 μm or about polyacrylate 30 μm may be applied. The glass of the cover window 210 may include soda lime glass, alkali alumino silicate glass, borosilicate glass, or lithium alumina silicate glass. The glass of the cover window 210 may include chemically reinforced or thermally reinforced glass to have strong strength. The chemical reinforcement may be achieved through an ion exchange treatment process in an alkali salt. The ion exchange treatment process may be performed two or more times. In addition, the cover window 210 may be formed by coating both side surfaces of a polymer film with a glass thin film.

When the cover window 210 includes plastic, it may be more advantageous to exhibit flexible properties such as folding. Examples of the plastic applicable to the cover window 210 may include, but are not limited to, polyimide, polyacrylate, polymethylmethacrylate (PMMA), polycarbonate (PC), polyethylene naphthalate (PEN), polyvinylidene chloride, polyvinylidene difluoride ("PVDF"), polystyrene, ethylene-vinyl alcohol copolymers, polyethersulfone (PES), polyetherimide ("PEI"), polyphenylene sulfide ("PPS"), polyallylate, tri-acetyl cellulose ("TAC"), and cellulose acetate propionate ("CAP"). The plastic cover window 210 may be formed of one or more of the plastic materials listed above.

In some embodiments, the front laminate structure 200 may further include a front coupling member that couples adjacent laminated members. For example, the front coupling member may be disposed between the cover window 210 and the shock absorbing layer 220 and between the shock absorbing layer 220 and the polarizing member 230 to couple them. The front coupling member may be a pressure sensitive adhesive ("PSA").

The back laminate structure 300 is disposed behind the display panel 100. The back laminate structure 300 may include a cushion layer 310 and a support member 320, which are sequentially laminated backward from the display panel 100.

The cushion layer 310 may absorb an external shock to prevent damage to the display panel 100. The cushion layer 310 may be formed as a single layer or a plurality of laminated layers. The cushion layer 310 may include, for example, a material having elasticity such as polyurethane resin or polyethylene resin. In an embodiment, the cushion layer 310 may include or be made of a foam material similar to a sponge.

The support member 320 may be disposed behind the cushion layer 310. The support member 320 may be a support member for coupling the display device 10 to a case. The support member 320 may include a material having rigidity. In an embodiment, the support member 320 may include or be made of a single metal or a metal alloy such as stainless steel ("SUS").

In some embodiments, the back laminate structure 300 may further include a heat dissipation member. The heat dissipation member may be disposed behind the support member 320. The heat dissipation member serves to diffuse heat generated from the display panel 100 or other components of the display device 10. In some embodiments, the heat dissipation member may include a first heat dissipation layer including graphite or carbon nanotubes, and a second heat dissipation layer capable of blocking electromagnetic waves and formed of a metal thin film such as copper, nickel, ferrite, or silver having excellent thermal conductivity.

The aforementioned support member 320 may be provided with a first support member 321 and a second support member 322 spaced apart from each other with the folding area FDA therebetween to facilitate folding. (See FIG. 7) Since the first support member 321 and the second support member 322 are spaced apart from each other, foreign matter may be introduced into a space therebetween, thereby deteriorating display quality. Hereinafter, a display device capable of preventing foreign matter from being introduced into a space between the first support member 321 and the second support member 322 will be described.

Figure 7:
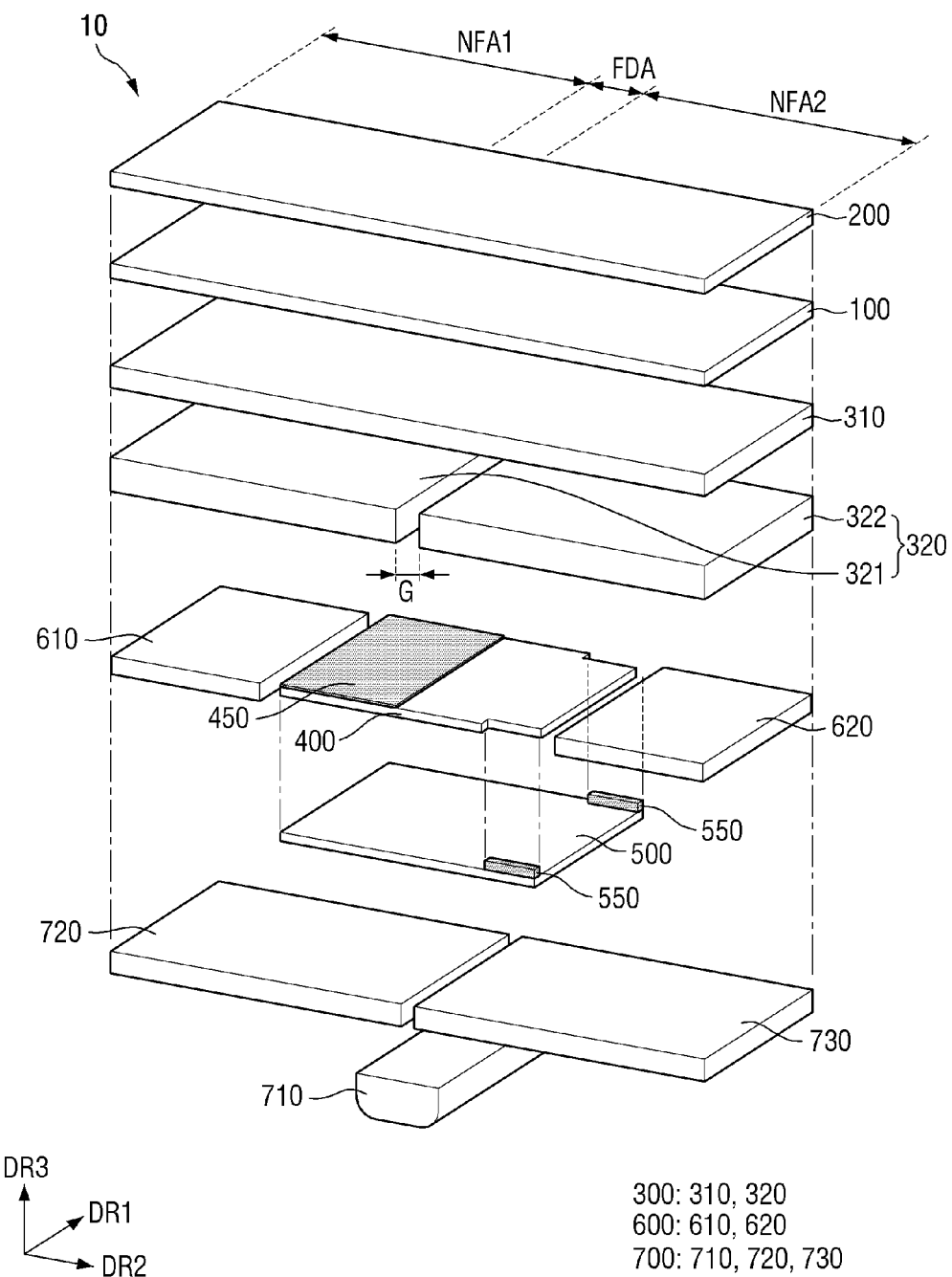
FIG. 7 is an exploded perspective view of a display device according to an embodiment.
Figure 8:
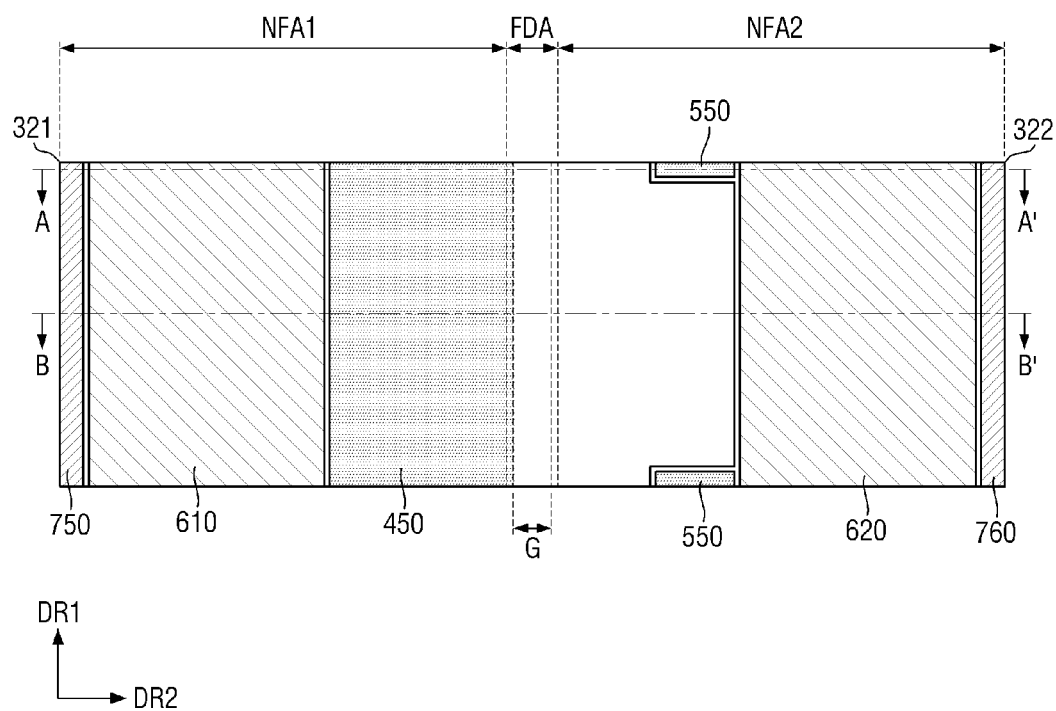
FIG. 8 is a plan view of a display device according to an embodiment.
Figure 9:
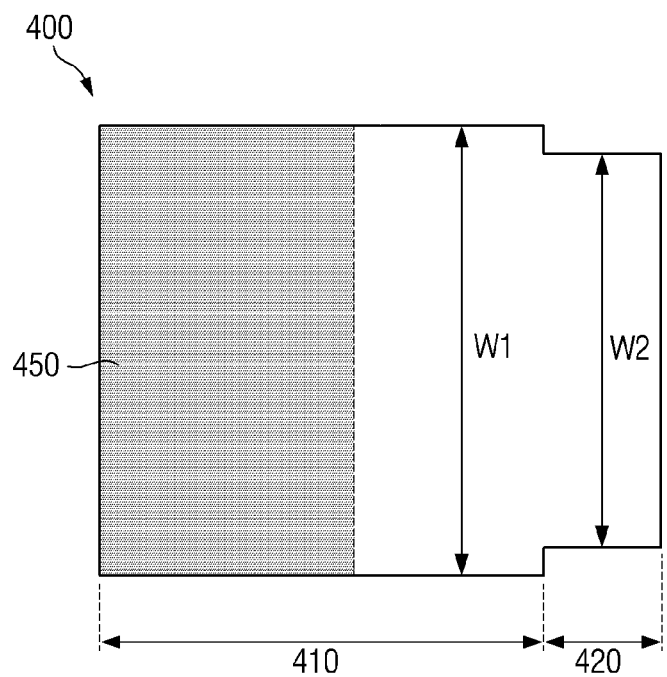
FIG. 9 is a plan view illustrating barrier sheets according to an embodiment.
Figure 9:
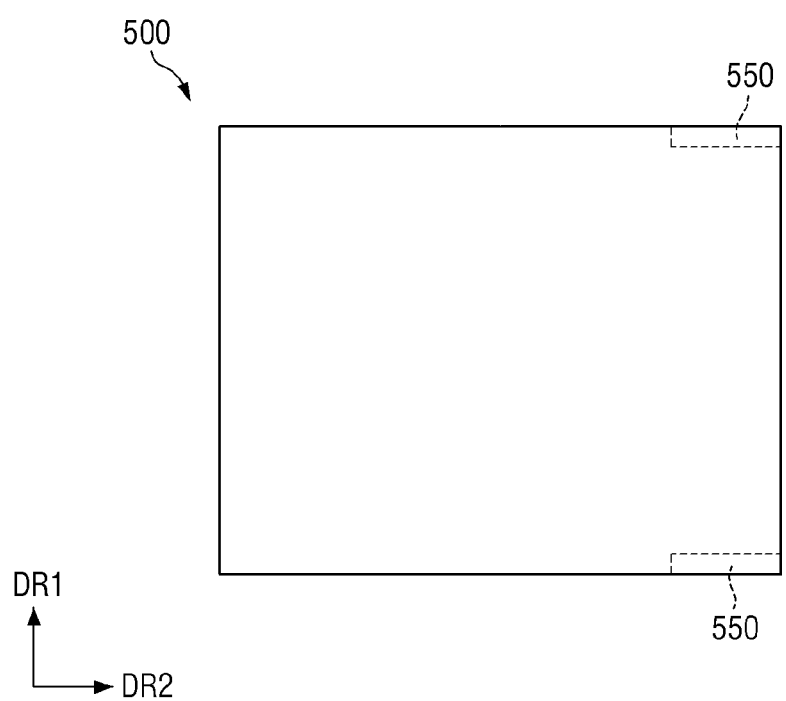
Figure 10:
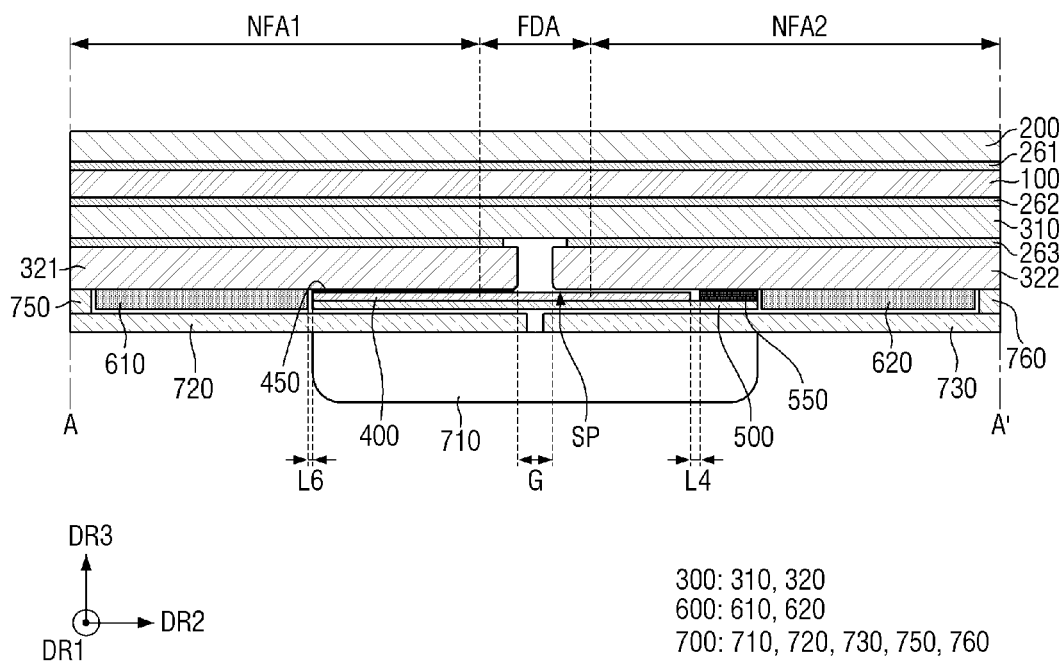
FIG. 10 is a cross-sectional view taken along line A-A' in FIG. 8.
Figure 11:
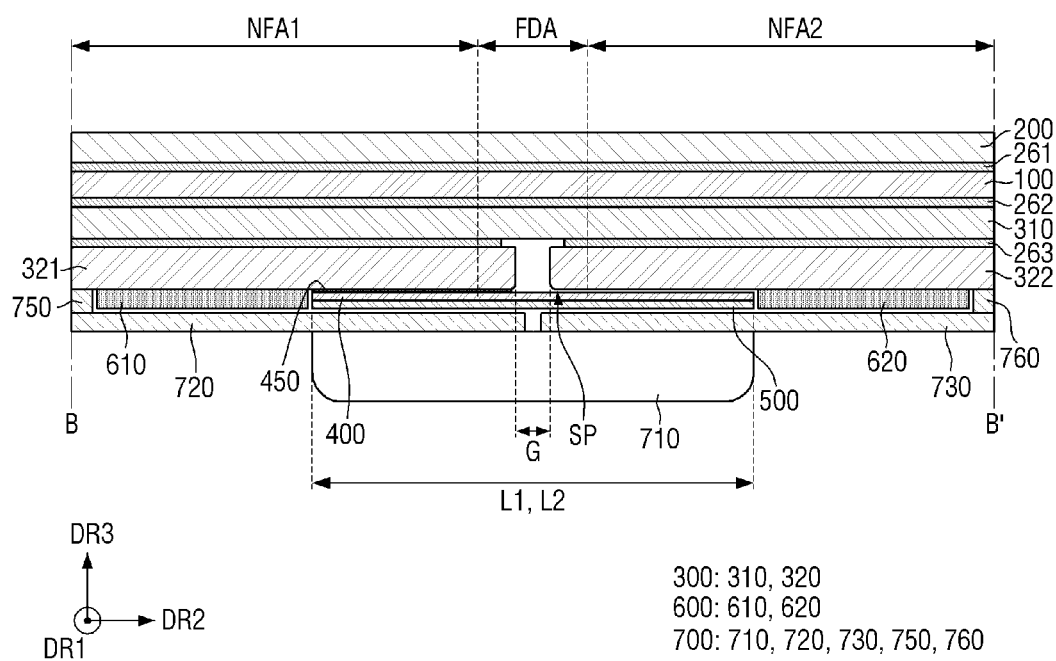
FIG. 11 is a cross-sectional view taken along line B-B' in FIG. 8.
Figure 12:
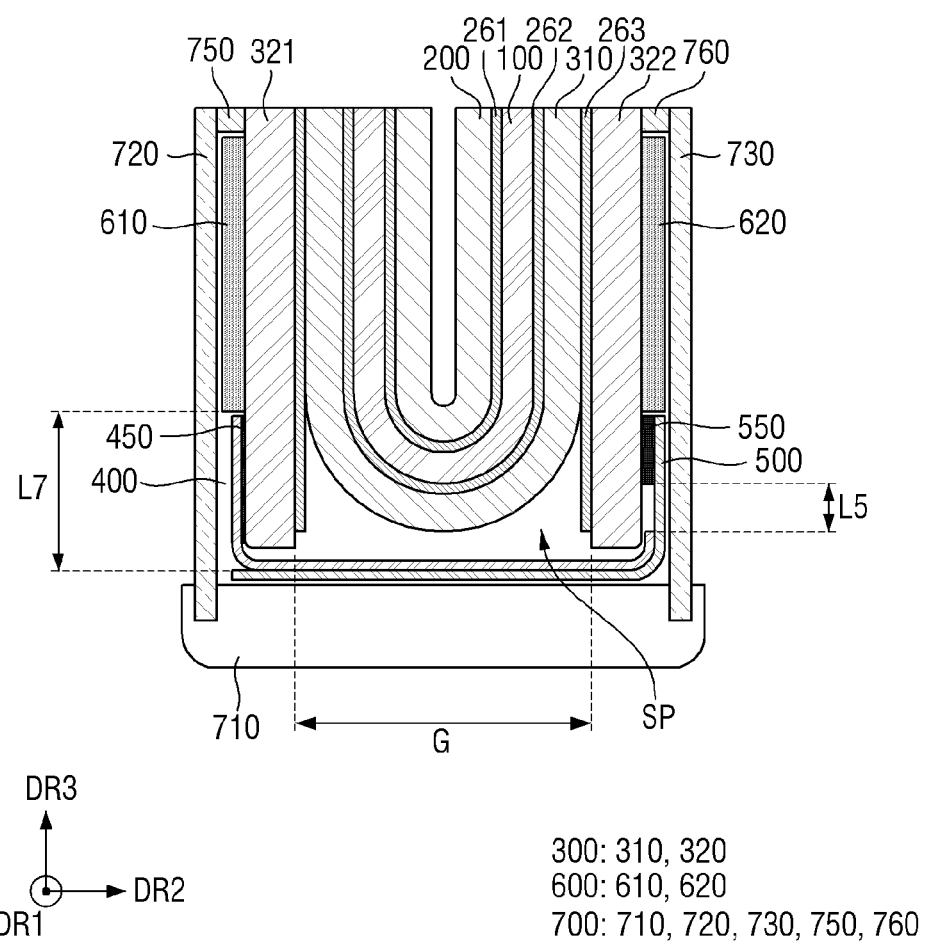
FIG. 12 is a cross-sectional view illustrating a folded state of a display device according to an embodiment.
Figure 13:
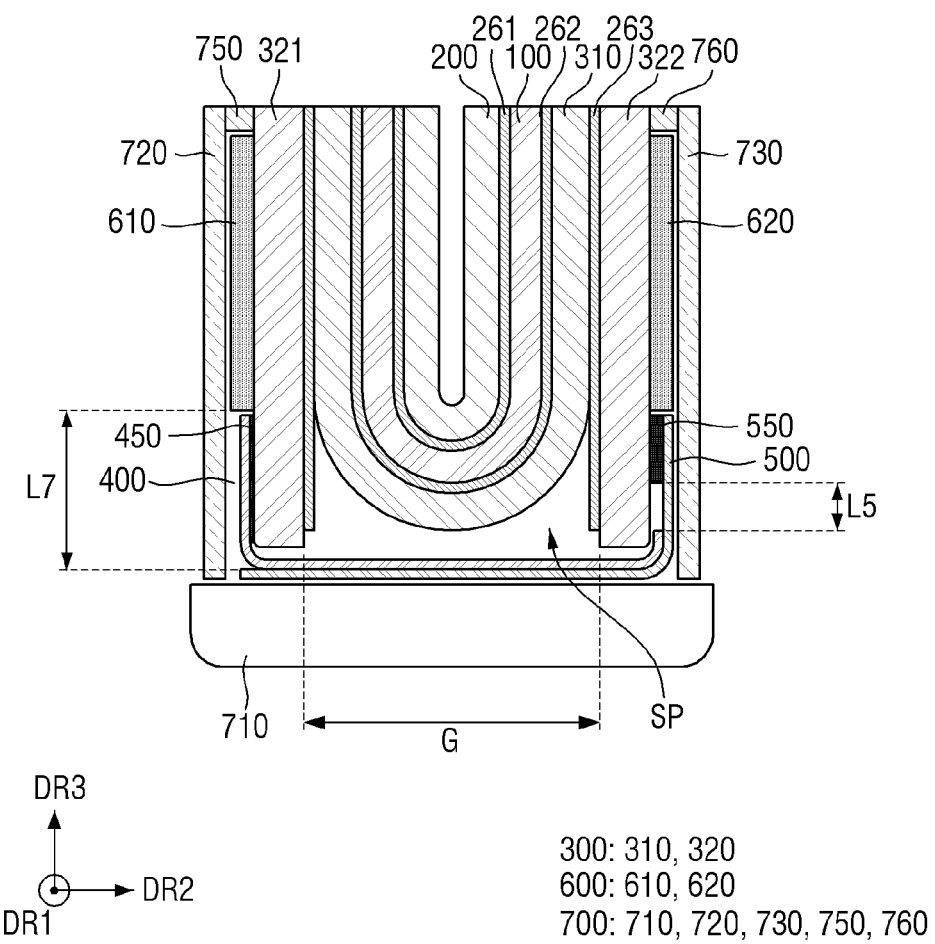
FIG. 13 is a cross-sectional view illustrating a folded state of a display device according to another embodiment.

FIG. 7 is an exploded perspective view of a display device according to an embodiment, FIG. 8 is a plan view of a display device according to an embodiment, FIG. 9 is a plan view illustrating barrier sheets according to an embodiment, FIG. 10 is a cross-sectional view taken along line A-A' in FIG. 8, FIG. 11 is a cross-sectional view taken along line B-B' in FIG. 8, FIG. 12 is a cross-sectional view illustrating a folded state of a display device according to an embodiment, and FIG. 13 is a cross-sectional view illustrating a folded state of a display device according to another embodiment.

Referring to FIGS. 5 and 7, as described above, in the display device 10, a front laminate structure 200 may be disposed in front of the display panel 100, and a back laminate structure 300 may be disposed behind the display panel 100. The front laminate structure 200 may include a polarization member 230, a shock absorbing layer 220, and a cover window 210. The back laminate structure 300 may include a cushion layer 310 disposed on the back surface of the display panel 100 and a support member 320 disposed on the back surface of the cushion layer 310.

The support member 320 may include a first support member 321 and a second support member 322 spaced apart from each other. The first support member 321 may be disposed in a direction opposite to the second direction DR2 with respect to the folding area FDA, and the second support member 322 may be disposed in the second direction DR2 with respect to the folding area FDA. Specifically, the first support member 321 may correspond to the first non-folding area NFA1, and may be disposed to overlap the first non-folding area NFA1 in the plan view in the unfolded state. The second support member 322 may correspond to the second non-folding area NFA2, and may be disposed to overlap the second non-folding area NFA2. A portion of each of the first support member 321 and the second support member 322 may overlap the folding area FDA in a plan view in the unfolded state. The first support member 321 and the second support member 322 may be disposed to be separated from each other. The first support member 321 and the second support member 322 may be spaced apart from each other with a gap G overlapping the folding area FDA in the second direction DR2. In some embodiments, the first support member 321 and the second support member 322 may be disposed to be at least partially connected to each other. The first support member 321 and the second support member 322 may be disposed symmetrically with each other with respect to the folding area FDA.

The display device 10 according to an embodiment may include a first barrier sheet 400 and a second barrier sheet 500 disposed on the back surface of the support member 320.

The first barrier sheet 400 and the second barrier sheet 500 may be disposed behind the support member 320. The first barrier sheet 400 and the second barrier sheet 500 may cover the gap G between the first support member 321 and the second support member 322 in the plan view in the unfolded state. Specifically, the first barrier sheet 400 and the second barrier sheet 500 cover the gap G between the first support member 321 and the second support member 322 as the gap G changes. The first barrier sheet 400 and the second barrier sheet 500 may include or be made of a flexible material that can be warped, bent, or rolled when the display device 10 is folded and unfolded. For example, the first barrier sheet 400 and the second barrier sheet 500 may include or be made of a plastic such as polyimide, polyacrylate, polymethyl methacrylate (PMMA), polycarbonate (PC), polyethylene naphthalate (PEN), polyvinylidene chloride, polyvinylidene difluoride (PVDF), polystyrene, an ethylene-vinyl alcohol copolymer, polyether sulphone (PES), polyether imide (PEI), polyphenylene sulfide (PPS), polyallylate, tri-acetyl cellulose (TAC), or cellulose acetate propionate (CAP). In another embodiment, the first barrier sheet 400 and the second barrier sheet 500 may be metal thin films. In another embodiment, the first barrier sheet 400 and the second barrier sheet 500 may include elastic fibers having a mesh structure.

In an embodiment, the first barrier sheet 400 and the second barrier sheet 500 may be attached to the support member 320 through an adhesive member. Specifically, the first barrier sheet 400 may be attached to the back surface of the first support member 321 through a first adhesive member 450. The second barrier sheet 500 may be attached to the back surface of the second support member 322 through a second adhesive member 550.

Each of the first adhesive member 450 and the second adhesive member 550 may be formed as a single layer or a plurality of laminated adhesive layers, and may include an adhesive layer on one side and the other side of the substrate, like a double-sided tape. For example, the first adhesive member 450 and the second adhesive member 550 may include at least one of a silicone adhesive, an acrylic adhesive, a crystalline polymer, and a rubber polymer.

The first adhesive member 450 may be disposed on one edge of the first barrier sheet 400. In other words, the first adhesive member 450 may be disposed on a front surface of the first barrier sheet 400. The first adhesive member 450 may be disposed to extend from one side of the first barrier sheet 400 in the first direction DR1. The first adhesive member 450 may not overlap the folding area FDA, and may overlap the first support member 321 in the plan view in the unfolded state.

The second adhesive member 550 may be disposed on at least one corner of the second barrier sheet 500. In an embodiment, the second adhesive member 550 may be disposed on at least two corners overlapping the second support member 322, respectively. In another embodiment, the second adhesive member 550 may be disposed to extend from one edge of the second barrier sheet 500 in the second direction DR2.

The display device 10 according to an embodiment may include a heat dissipation member 600 disposed on the back surface of the support member 320. The heat dissipation member 600 may include a first heat dissipation member 610 and a second heat dissipation member 620 spaced apart from each other.

The first heat dissipation member 610 may be disposed in a direction opposite to the second direction DR2 with respect to the folding area FDA, and the second heat dissipation member 620 may be disposed in the second direction DR2. Specifically, the first heat dissipation member 610 may be disposed on the back surface of the first support member 321 to overlap the first support member 321 in the plan view in the unfolded state. The second heat dissipation member 620 may be disposed on the back surface of the second support member 322 to overlap the second support member 322. The first heat dissipation member 610 and the second heat dissipation member 620 may be disposed to be separated from each other.

The first heat dissipation member 610 may be disposed on the same plane as the first barrier sheet 400, and may be disposed to be spaced apart from the first barrier sheet 400.

In other words, the first heat dissipation member 610 may be disposed on a portion of the back surface of the first support member 321, and the first barrier sheet 400 may be disposed on the remaining part thereof. The second heat dissipation member 620 may be disposed on the same plane as the second barrier sheet 500, and may be disposed to be spaced apart from the second barrier sheet 500. In other words, the second heat dissipation member 620 may be disposed on a portion of the back surface of the second support member 322, and the second barrier sheet 500 may be disposed on the remaining part thereof.

The display device 10 according to an embodiment may include a connection unit 700 disposed behind the first barrier sheet 400 and the second barrier sheet 500. The connection unit 700 may include a hinge structure 710, and a first hinge bracket 720 and a second hinge bracket 730 coupled to the hinge structure 710 to be coupled with the first support member 321 and the second support member 322, respectively.

The hinge structure 710 may be disposed in the first direction DR1 to change an angle between the first support member 321 and the second support member 322 in the folding area FDA, thereby enabling folding and unfolding.

The hinge structure 710 may be a multi-axial hinge structure. Although not shown in detail in FIG. 7, the hinge structure 710 may include a plurality of brackets and a plurality of gears, and may be driven such that the first hinge bracket 720 coupled to the first support member 321 and the second hinge bracket 730 coupled to the second support member 322 are rotated in different directions from each other with respect of each rotation axis by the plurality of gears as the angle between the first support member 321 and the second support member 322 changes. In the present embodiment, the structure or number of the connection unit 700 is not limited to the hinge structure 710, and the connection unit 700 may include all structures capable of folding or unfolding the display device 10 by connecting the first support member 321 and the second support member 322 such that the angle between the first support member 321 and the second support member 322 changes.

Hereinafter, the first barrier sheet 400, the second barrier sheet 500, the first heat dissipation member 610, and the second heat dissipation member 620, which are disposed behind the support member 320, will be described in detail. FIG. 8 shows a plane viewed from the back of the display device 10, and it is shown in FIG. 8 that the first barrier sheet 400, the second barrier sheet 500, the first heat dissipation member 610, and the second heat dissipation member 620 appear by omitting the connection unit 700.

Referring to FIGS. 8 and 9, the first support member 321 and the second support member 322 may be disposed to be spaced apart from each other with a space G in an area overlapping the folding area FDA in the plan view. The first coupling member 750 may be disposed on one side of the back surface of the first support member 321, that is, on one edge thereof disposed in a direction opposite to the second direction DR2, and the second coupling member 760 may be disposed on the other edge thereof in the second direction DR2. The first coupling member 750 may attach the first hinge bracket 720 to the back surface of the first support member 321, and the second coupling member 760 may attach the second hinge bracket 730 to the back surface of the second support member 322. Each of the first coupling member 750 and the second coupling member 760 may be disposed to extend in the first direction DR1.

The first heat dissipation member 610 may be disposed in one area of the back surface of the first support member 321 in the second direction DR2 from the first coupling member 750. The first heat dissipation member 610 may be disposed to be spaced apart from the first coupling member 750 by a predetermined distance. The second heat dissipation member 620 may be disposed in an area of the back surface of the second support member 322 in a direction opposite to the second direction DR2 from the second coupling member 760. The second heat dissipation member 620 may be disposed to be spaced apart from the second coupling member 760 by a predetermined distance.

The first adhesive member 450 may be disposed in an area of the back surface of the first support member 321 in the second direction DR2 from the first heat dissipation member 610. The first adhesive member 450 may be disposed to be spaced apart from the first heat dissipation member 610 by a predetermined distance, and may be disposed to extend to an edge of the first support member 321 adjacent to the folding area FDA. The second adhesive member 550 may be disposed in an area of the back surface of the second support member 322 and extended in a direction opposite to the second direction DR2 from the second heat dissipation member 620. The second adhesive members 550 may be disposed on a portion of the upper edge of the second support member 322 and a portion of the lower edge of the second support member 322, respectively. The second adhesive member 550 may be disposed to be spaced apart from the second heat dissipation member 620 by a predetermined distance, and may be disposed to be spaced apart from the edge of the second support member 322 adjacent to the folding area FDA. The second adhesive member 550 may be thicker than the first adhesive member 450 in the thickness direction DR3.

The first barrier sheet 400 may be disposed behind the first support member 321 and the second support member 322, and at least a portion of the first barrier sheet 400 may be fixed to the first support member 321. At least a portion of the first barrier sheet 400 may be attached to the first adhesive member 450 formed on the first supporting member 321 to be fixed to the first supporting member 321.

The first barrier sheet 400 may include a first barrier area 410 and a second barrier area 420. The first barrier area 410 may be an area overlapping the first support member 321, the folding area FDA, and the second support member 322, and the second barrier area 420 may an area overlapping the second support member 322 and not overlapping the first support member 321 and the folding region FDA in the plan view in the unfolded state. The width W1 of the first barrier area 410 in the first direction DR1 may be greater than the width W2 of the second barrier area 420 in the first direction DR1. That is, an area of the first barrier sheet 400 having a large width in the first direction DR1 may be the first barrier area 410, and an area of the first barrier sheet 400 having a relatively small width in the first direction DR1 may be the second barrier area 420. Further, the second barrier area 420 of the first barrier sheet 400 may be disposed between the second adhesive members 550.

The second barrier sheet 500 may be disposed behind the first support member 321 and the second support member 322, and at least a portion of the second barrier sheet 500 may be fixed to the second support member 322. At least a portion of the second barrier sheet 500 may be adhered to the second adhesive member 550 formed on the second support member 322 to be fixed to the second support member 322. The second barrier sheet 500 may have a substantially rectangular shape, and may be adhered to the second adhesive members 550 respectively disposed at both corners.

As shown in FIGS. 8 and 9, the second barrier sheet 500 may cover and overlap the entire first barrier sheet 400 in the plan view in the unfolded state. For this purpose, the planar area of the second barrier sheet 500 may be larger than the planar area of the first barrier sheet 400. The four long sides of the first barrier sheet 400 may be aligned with and coincide with the four long sides of the second barrier sheet 500. Here, the long sides refer to the four longest sides of all the sides of each of the first barrier sheet 400 and the second barrier sheet 500. However, the first barrier sheet 400 may have a relatively smaller planar area than the second barrier sheet 500 due to the second barrier area 420.

Hereinafter, unfolding and folding states of the display device 10 according to an embodiment will be described in detail through cross-sectional views.

Referring to FIGS. 10 and 11, the display device 10 according to an embodiment may include a front laminate structure 200 disposed in front of the display panel 100 and a back laminate structure disposed behind the display panel 100 and including a cushion layer 310 and a support member 320. Third coupling members 261, 262, and 263 may be arranged between the display panel 100 and the front laminate structure 200, between the display panel 100 and the cushion layer 310, and between the cushion layer 310 and the support member 320, respectively, to couple them together. Each of the third coupling members 261, 262, and 263 may include or be made of a transparent material, and may be, for example, a pressure sensitive adhesive (PSA).

The first support member 321 and the second support member 322 may be spaced apart from each other by a space G in an area overlapping the folding area FDA in the plan view. The space G between the first support member 321 and the second support member 322 may serve as a passage through which foreign matter is introduced. Accordingly, in the present embodiment, the first barrier sheet 400 and the second barrier sheet 500 are formed to overlap the gap G in the plan view, thereby preventing foreign matter from being introduced into the gap G.

Specifically, the first barrier sheet 400 may be attached to a portion of the back surface of the first support member 321 through the first adhesive member 450. The second barrier sheet 500 may be attached to a portion of the back surface of the second support member 322 through the second adhesive member 550.

The first barrier sheet 400 may extend from the first support member 321 to the second support member 322, thereby overlapping the first support member 321, the folding area FDA, and the second support member 322 in the plan view in the unfolded state. Further, the first barrier sheet 400 may overlap the space G between the first support member 321 and the second support member 322, thereby covering the gap G. One side of the first barrier sheet 400 disposed in a direction opposite to the second direction DR2 may be spaced apart from the first heat dissipation member 610 disposed on the back surface of the first support member 321. The first coupling member 750 may be disposed on the back surface of the first support member 321 in a direction opposite to the second direction DR2 of the first heat dissipation member 610. A portion of the other side of the first barrier sheet 400 disposed in the second direction DR2 may be adjacent to the second adhesive member 550 but spaced apart from the second adhesive member 550. Further, as shown in FIG. 11, another portion of the other side of the first barrier sheet 400 disposed in the second direction DR2 may be adjacent to the second heat dissipation member 620 but spaced apart from the second heat dissipation member 620.

The second barrier sheet 500 may extend from the second support member 322 to the first support member 321, thereby overlapping second support member 322, the folding area FDA, and the first support member 321 in the plan view in the unfolded state. Further, the second barrier sheet 500 may overlap the space G between the first support member 321 and the second support member 322, thereby covering the gap G. One side of the second barrier sheet 500 disposed in the second direction DR2 may be spaced apart from the second heat dissipation member 620 disposed on the back surface of the second support member 322. The second coupling member 760 may be disposed on the back surface of the second support member 322 in the second direction DR2 of the second heat dissipation member 620. The other side of the second barrier sheet 500 disposed in a direction opposite to the second direction DR2 may be adjacent to the first heat dissipation member 610 but spaced apart from the first heat dissipation member 610.

In an embodiment, the first barrier sheet 400 may be accommodated in a space SP between the second barrier sheet 500 and the first support member 321 and between the second barrier sheet 500 and the second support member 322. As shown in FIGS. 10 and 11, the second barrier sheet 500 may be disposed to overlap and cover the entire first barrier sheet 400 in the third direction DR3. For this purpose, the thickness T1 of the second adhesive member 550 for fixing the second barrier sheet 500 to the second support member 322 may be larger than the thickness T2 of the first adhesive member 450 for fixing the first barrier sheet 400 to the first support member 321. Accordingly, the second barrier sheet 500 may be disposed behind the first barrier sheet 400 to cover the first barrier sheet 400 behind the first barrier sheet 400.

The first barrier sheet 400 and the second barrier sheet 500 may be disposed to be substantially in contact with each other. In an embodiment, the thickness T1 of the second adhesive member 550 may be substantially equal to the sum of the thickness T2 of the first adhesive member 450 and the thickness of the first barrier sheet 400. In another embodiment, the first barrier sheet 400 and the second barrier sheet 500 may be spaced apart by a predetermined distance in the third direction DR3. In another embodiment, the first barrier sheet 400 and the second barrier sheet 500 may be spaced apart from each other in the third direction DR3 in at least some areas, and may contact each other in other areas.

As shown in FIG. 11, the maximum length L1 of the second barrier sheet 500 in the second direction DR2 may be greater than or equal to the maximum length L2 of the first barrier sheet 400 in the second direction DR2. In the display device 10 in the unfolded state, the second barrier sheet 500 may cover the first barrier sheet 400 as much as possible, thereby preventing foreign matter from being introduced into the space G between the first support member 321 and the second support member 322. In another embodiment, as long as the second barrier sheet 500 can cover the space G between the first support member 321 and the second support member 322, the maximum length L1 of the second barrier sheet 500 may be smaller than the maximum length L2 of the first barrier sheet 400.

The display device 10 in the folded state is described as follows with reference to FIG. 12.

As shown in FIG. 12, in the folded state of the display device 10, the portions of the first support member 321 and the second support member 322 disposed in the non-folding areas NFA1 and NFA2 may be attached to the cushion layer 310, and the portion thereof disposed in the folding area FDA may not be attached to the back surface of the cushion layer 310. Accordingly, in the unfolded state of the display device 10, the portions of the first support member 321 and the second support member 322 disposed in the non-folding areas NFA1 and NFA2 may be attached closely to the back surfaces of the non-folding areas NFA1 and NFA2 of the cushion layer 310 to support the display panel 100. Further, in the folded state of the display device 10, the portions of the first support member 321 and the second support member 322 disposed in the non-folding areas NFA1 and NFA2 may be spaced apart from the back surface of the cushion layer 310 to secure a curvature radius of the display panel 100.

In the unfolded state of the display device 10, the first support member 321 and the second support member 322 may be disposed to form the gap G. As shown in FIG. 12, in the folded state of the display device 10, the gap G between the first support member 321 and the second support member 322 may increase.

As the gap G between the first support member 321 and the second support member 322 increases, the first barrier sheet 400 of the present embodiment may slide in a direction opposite to the second directions DR2 in the space between the second barrier sheet 500 and the first support member 321 and the space between the second barrier sheet 500 and the second support member 322. Accordingly, one side of the first barrier sheet 400 adjacent to the second adhesive member 550 may be away from the second adhesive member 550. The second barrier sheet 500 may slide in the second direction DR2 as the gap G between the first support member 321 and the second support member 322 increases. Accordingly, one side of the second barrier sheet 500 adjacent to the first adhesive member 450 may be away from the first adhesive member 450.

As shown in FIGS. 10 and 12, one side of the first barrier sheet 400 may face one side of the second adhesive member 550 in the unfolded state of the display device 10. Here, one side of the first barrier sheet 400 and one side of the second adhesive member 550 may be spaced apart from each other by a predetermined distance L4 in the second direction DR2. In the folded state of the display device 10, as the first barrier sheet 400 slides in a direction opposite to the second direction DR2 to move one side thereof, the distance L5 between one side of the first barrier sheet 400 and one side of the second adhesive member 550 may be further increased. That is, the distance L4 between one side of the first barrier sheet 400 and one side of the second adhesive member 550 in the unfolded state of the display device 10 may be shorter than the distance L5 between one side of the first barrier sheet 400 and one side of the second adhesive member 550 in the folded state of the display device 10.

Similarly, one side of the second barrier sheet 500 may face one side of the first heat dissipation member 610 in the unfolded state of the display device 10. Here, one side of the second barrier sheet 500 and one side of the first heat dissipation member 610 may be spaced apart from each other by a predetermined distance L6 in the second direction DR2. In the folded state of the display device 10, as the second barrier sheet 500 slides in the second direction DR2 to move one side thereof, the distance L7 between one side of the second barrier sheet 500 and one side of the first heat dissipation member 610 may be further increased. That is, the distance L6 between one side of the second barrier sheet 500 and one side of the first heat dissipation member 610 in the unfolded state of the display device 10 may be shorter than the distance L7 between one side of the second barrier sheet 500 and one side of the first heat dissipation member 610 in the folded state of the display device 10.

The hinge structure 710 may guide the second barrier sheet 500 to be bent. At least a portion of one surface of the hinge structure 710, that is, the upper surface thereof may be disposed in parallel to the second barrier sheet 500. Accordingly, when the display device 10 is folded, the second barrier sheet 500 may be bent or warped by the upper surface of the hinge structure 710 while sliding in the second direction DR2, and may maintain a bent shape or a warped shape. That is, the second barrier sheet 500 may be bent or warped according to the shape of the upper surface of the hinge structure 710, and the first barrier sheet 400 may be bent or warped according to the bent or warped shape of the second barrier sheet 500. Although it shown in FIG. 12 that the second barrier sheet 500 is spaced apart from the hinge structure 710, at least a portion of the second barrier sheet 500 may be in contact with the hinge structure 710.

The hinge structure 710 is coupled with the first hinge bracket 720 and the second hinge bracket 730, so that each of the first hinge bracket 720 and the second hinge bracket 730 may be rotated by the plurality of gears included in the hinge structure 710. As shown in FIG. 12, during folding, the first hinge bracket 720 and the second hinge bracket 730 may be connected to the hinge structure 710, and one end of each of the first hinge bracket 720 and the second hinge bracket 730 may be inserted into the hinge structure 710. Further, as shown in FIG. 13, the first hinge bracket 720 and the second hinge bracket 730 may be connected to the hinge structure 710, and one end of each of the first hinge bracket 720 and the second hinge bracket 730 may be disposed to be spaced apart from the hinge structure 710.

The second barrier sheet 500 may be disposed between the hinge structure 710 and the first support member 321 and between the hinge structure 710 and the second support member 322. The second barrier sheet 500 may overlap the side surface of the first support member 321 and the side surface of the second support member 322 in the second direction DR2, and may also overlap the gap G between the first support member 321 and the second support member 322 in the plan view. The first barrier sheet 400 may guided by the bent shape of the second barrier sheet 500 to be bent in the same manner as the second barrier sheet 500. The first barrier sheet 400 may be disposed between the second barrier sheet 500 and the first support member 321 and between the second barrier sheet 500 and the second support member 322. The first barrier sheet 400 may overlap the side surface of the first support member 321 and the side surface of the second support member 322 in the second direction DR2, and may also overlap the gap G between the first support member 321 and the second support member 322 in the plan view.

Therefore, since the first barrier sheet 400 and the second barrier sheet 500 may doubly cover the gap G between the first support member 321 and the second support member 322 double, the introduction of foreign matter may be prevented.

The above-described second barrier sheet 500 may cover only a portion of the first barrier sheet 400.

Figure 14:
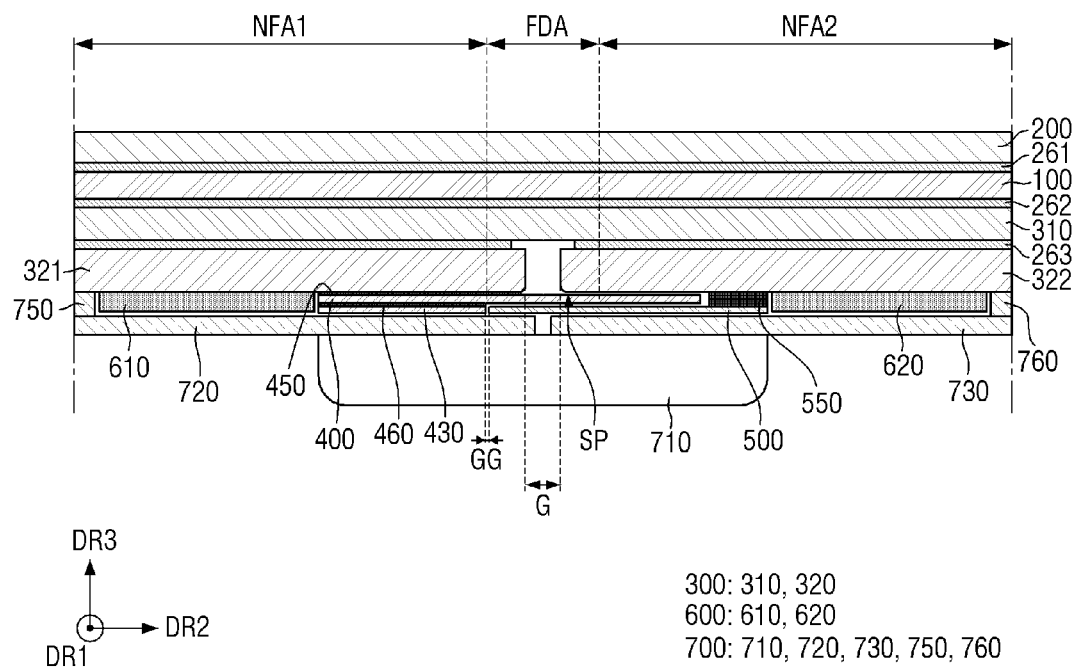
FIGS. 14 to 16 are cross-sectional views illustrating various structures of barrier sheets of a display device according to other embodiments.
Figure 15:
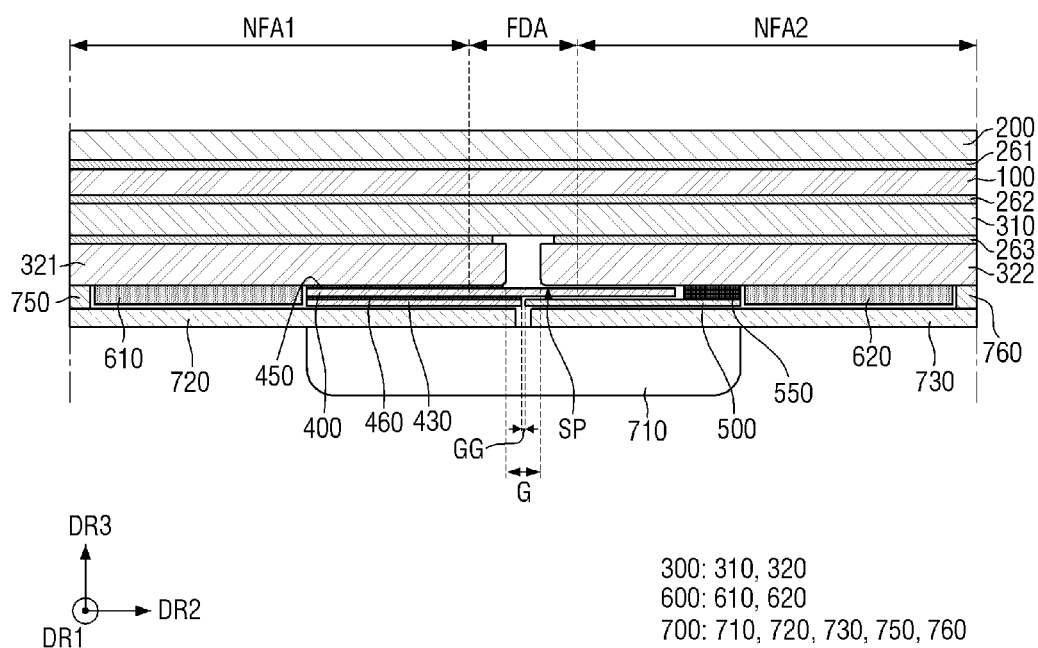
Figure 16:
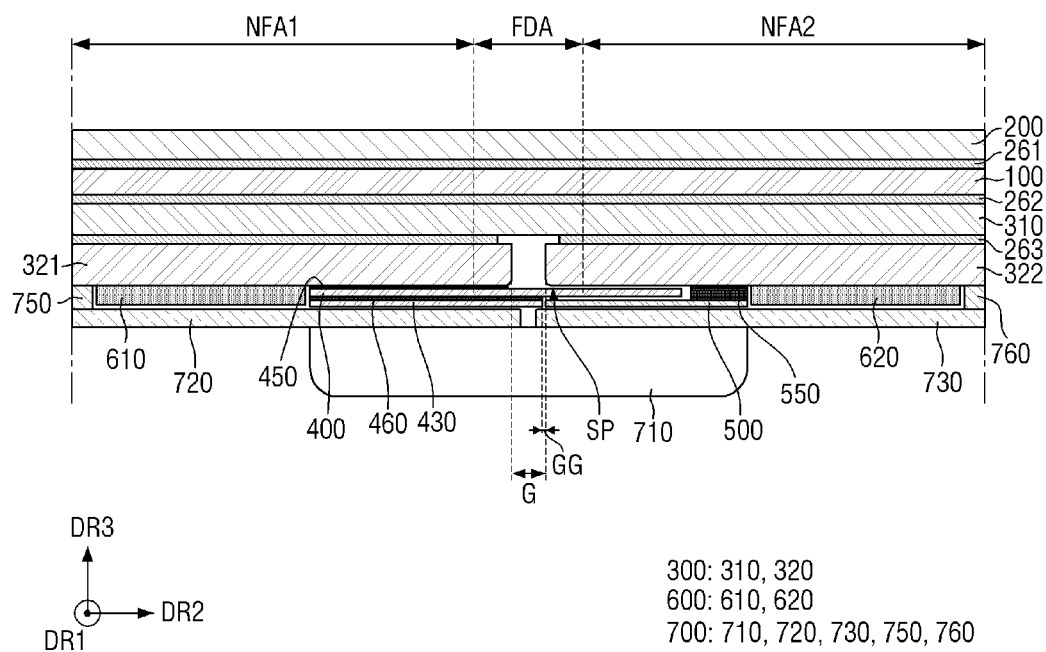

FIGS. 14 to 16 are cross-sectional views illustrating various structures of barrier sheets of a display device according to other embodiments.

Referring to FIG. 14, the second barrier sheet 500 may overlap a portion of the first barrier sheet 400 in the plan view. The second barrier sheet 500 may overlap the first support member 321, the folding area FDA, and the second support member 322. One side of the second barrier sheet 500 in a direction opposite to the second direction DR2 may be disposed to be spaced apart from one side of the first barrier sheet 400 in a direction opposite to the second direction DR2. When there is an area where the second barrier sheet 500 and the first barrier sheet 400 do not overlap each other in the plan view, there is a problem that wrinkles may be easily recognized in the vicinity of the folding area FDA of the display device 10 due to a difference in thickness between the area where the second barrier sheet 500 and the first barrier sheet 400 overlap each other and the area where the second barrier sheet 500 and the first barrier sheet 400 do not overlap each other in the plan view.

In the present embodiment, in order to compensate for the difference in thickness of the display device 10 in the non-overlapping area of the first barrier sheet 400 and the second barrier sheet 500 in the plan view, a third barrier sheet 430 may be disposed on a back surface of the first barrier sheet 400, where the back surface does not overlap the second barrier sheet 500 in the plan view. Like the first barrier sheet 400 and the second barrier sheet 500, the third barrier sheet 430 may include or be made of a flexible material. The third barrier sheet 430 may overlap the first support member 321 and the first barrier sheet 400, and may not overlap the folding area FDA and the second support member 322 in the plan view.

A third adhesive member 460 is disposed between the third barrier sheet 430 and the first barrier sheet 400 to attach the third barrier sheet 430 to the first barrier sheet 400. Since the size of the third adhesive member 460 is the same as the size of the third barrier sheet 430, it is possible to prevent wrinkles from being visually recognized due to a difference in thickness of the display device 10. However, in another embodiment, the size of the third adhesive member 460 may be smaller than the size of the third barrier sheet 430.

As shown in FIG. 14, the third barrier sheet 430 and the second barrier sheet 500 are disposed on the same plane, and may be spaced apart from each other. A gap GG between the third barrier sheet 430 and the second barrier sheet 500 may overlap the first support member 321, and may not overlap the folding area FDA in the plan view. Since the gap GG between the third barrier sheet 430 and the second barrier sheet 500 may serve as a cause for wrinkles to be visually recognized, it is preferable not to overlap the folding area FDA in the plan view.

As shown in FIG. 15, the second barrier sheet 500 may have a length smaller than that of the first barrier sheet 400. As the length of the second barrier sheet 500 decreases, the length of the third barrier sheet 430 may further increase.

One side of the second barrier sheet 500 in a direction opposite to the second direction DR2 may overlap the folding area FDA, and one side of the third barrier sheet 430 in the second direction DR2 may overlap the folding area FDA. Therefore, the gap GG between the third barrier sheet 430 and the second barrier sheet 500 may not overlap the first support member 321 and the second support member 322 in the plan view, and may overlap the folding area FDA.

Further, as shown in FIG. 16, the second barrier sheet 500 may have a length smaller than that of the first barrier sheet 400. As the length of the second barrier sheet 500 decreases, the length of the third barrier sheet 430 may further increase.

One side of the second barrier sheet 500 in a direction opposite to the second direction DR2 may be aligned with one side of the second support member 322. If one side of the second barrier sheet 500 in a direction opposite to the second direction DR2 is further disposed in the second direction DR2, during folding, the first barrier sheet 400 may not be accommodated in the space between the second barrier sheet 500 and the second support member 322, and may be separated. Accordingly, one side of the second barrier sheet 500 in a direction opposite to the second direction DR2 may be aligned with one side of the second support member 322. One side of the third barrier sheet 430 in the second direction DR2 may overlap the folding area FDA. Therefore, the gap GG between the third barrier sheet 430 and the second barrier sheet 500 may not overlap the first support member 321 and the second support member 322, and may overlap the folding area FDA in the plan view.

Figure 17:
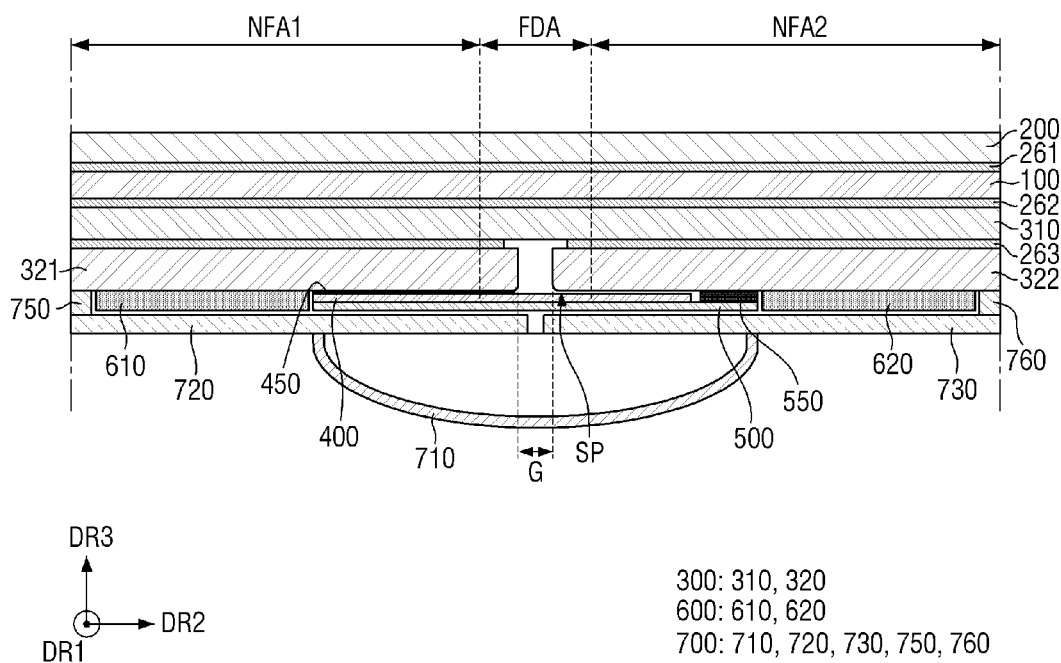
FIG. 17 is a cross-sectional view illustrating an unfolded state of a display device according to another embodiment.
Figure 18:
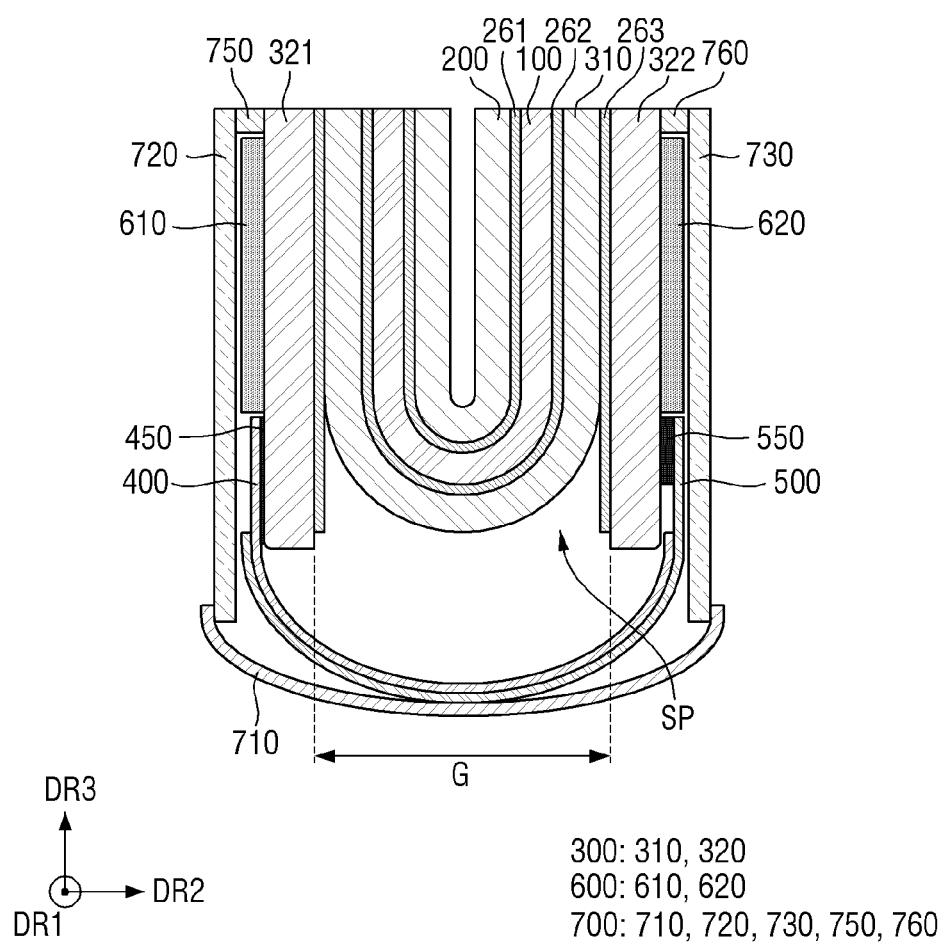
FIG. 18 is a cross-sectional view illustrating a folded state of a display device according to another embodiment.
Figure 19:
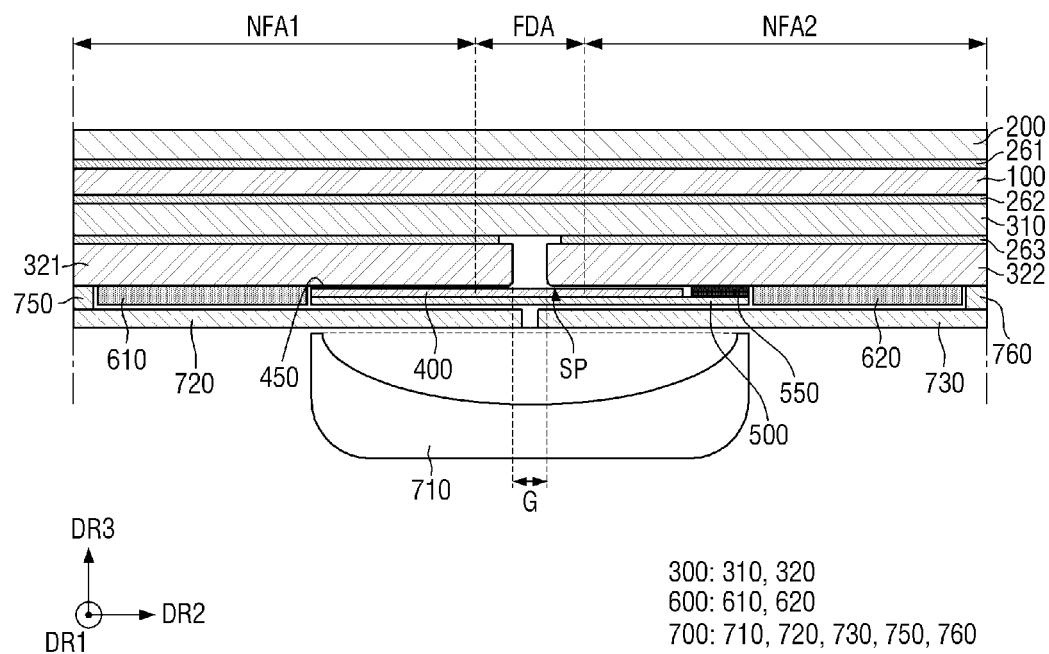
FIG. 19 is a cross-sectional view illustrating an unfolded state of a display device according to still another embodiment.
Figure 20:
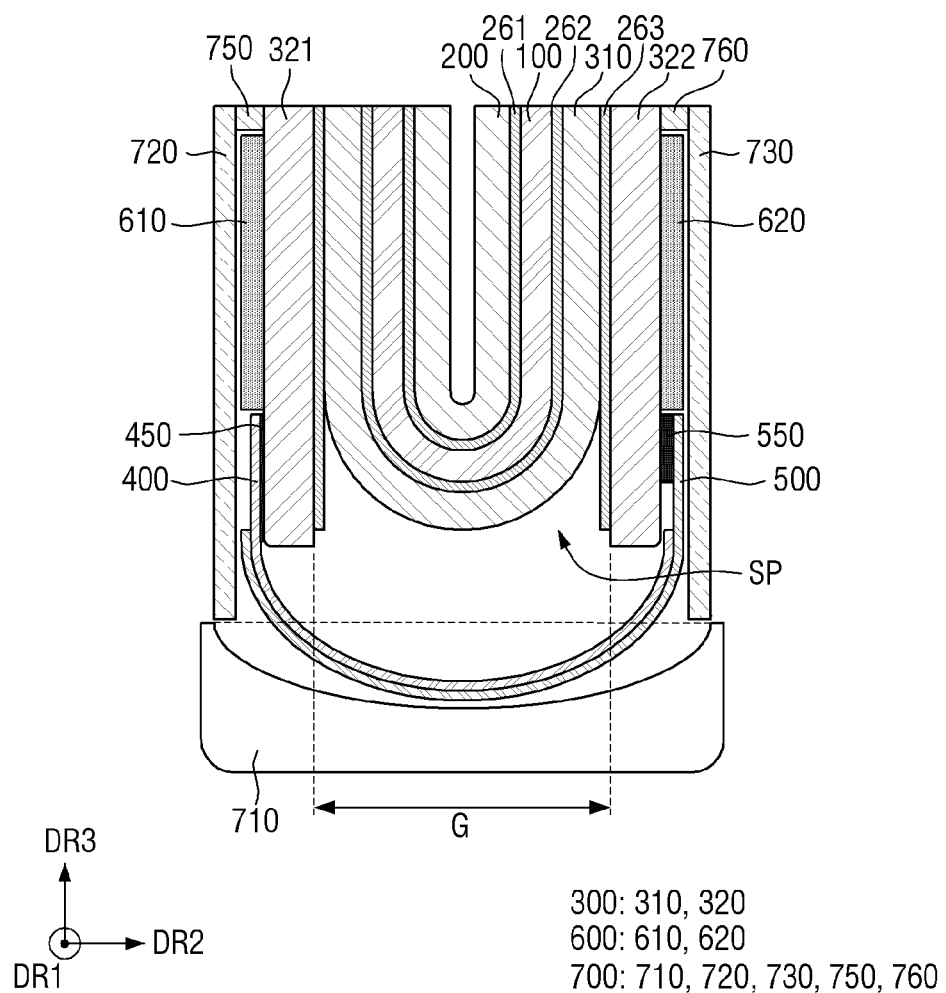
FIG. 20 is a cross-sectional view illustrating a folded state of a display device according to still another embodiment.

FIG. 17 is a cross-sectional view illustrating an unfolded state of a display device according to another embodiment, FIG. 18 is a cross-sectional view illustrating a folded state of a display device according to another embodiment, FIG. 19 is a cross-sectional view illustrating an unfolded state of a display device according to still another embodiment, and FIG. 20 is a cross-sectional view illustrating a folded state of a display device according to still another embodiment.

Referring to FIGS. 17 and 18, the display device 10 according to the present embodiment may include a first barrier sheet 400, a second barrier sheet 500, and a hinge structure 710. In particular, the present embodiment is different from the aforementioned embodiment of FIGS. 7 to 16 in that the hinge structure 710 has a different shape, and thus the first barrier sheet 400 and the second barrier sheet 500 have different bent shapes. Other configurations are substantially the same or similar. Therefore, redundant descriptions are omitted, and differences will be mainly described.

Referring to FIG. 17, the hinge structure 710 has a concave round shape, and may thus include a space in which the first barrier sheet 400 and the second barrier sheet 500 may be accommodated. The hinge structure 710 is coupled with the first hinge bracket 720 and the second hinge bracket 730, so that each of the first hinge bracket 720 and the second hinge bracket 730 may be rotated by the plurality of gears included in the hinge structure 710. The hinge structure 710 may be disposed to overlap the first hinge bracket 720 and the second hinge bracket 730, and may also overlap the first barrier sheet 400 and the second barrier sheet 500 in the plan view.

As shown in FIG. 18, in the folded state of the display device 10, the gap G between the first support member 321 and the second support member 322 may increase.

As the gap G between the first support member 321 and the second support member 322 increases, the first barrier sheet 400 of the present embodiment may slide in a direction opposite to the second directions DR2 in the space between the second barrier sheet 500 and the first support member 321 and the space between the second barrier sheet 500 and the second support member 322. Accordingly, one side of the first barrier sheet 400 adjacent to the second adhesive member 550 may be away from the second adhesive member 550. The second barrier sheet 500 may slide in the second direction DR2 as the gap G between the first support member 321 and the second support member 322 increases. Accordingly, one side of the second barrier sheet 500 adjacent to the first adhesive member 450 may be away from the first adhesive member 450.

The hinge structure 710 may guide the second barrier sheet 500 to be bent. The hinge structure 710 may have a shape in which one surface thereof facing the second barrier sheet 500 is concavely rounded. Accordingly, when the display device 10 is folded, the second barrier sheet 500 may slide in the second direction DR2 and simultaneously bent according to the concave shape due to the concave surface of the hinge structure 710, and may maintain the bent shape. Although it is shown in FIG. 18 that the second barrier sheet 500 is spaced apart from the hinge structure 710, at least a portion of the second barrier sheet 500 may be in contact with the hinge structure 710.

Referring to FIGS. 19 and 20, in some embodiments, the hinge structure 710 may have a shape in which one surface thereof facing the second barrier sheet 500 is concavely rounded. Unlike FIGS. 17 and 18, the hinge structure 710 may be thick. In an area where the hinge structure 710 is thick, there is provided a structure in which the hinge structure 710 including a plurality of gears and the first hinge bracket 720 and the second hinge bracket 730 may be folded and unfolded.

The second barrier sheet 500 may be disposed between the hinge structure 710 and the first support member 321 and between the hinge structure 710 and the second support member 322. The second barrier sheet 500 may overlap the side surface of the first support member 321 and the side surface of the second support member 322 in the second direction DR2, and may also overlap the gap G between the first support member 321 and the second support member 322 in the plan view in the folded state. The first barrier sheet 400 may be guided according to the bent shape of the second barrier sheet 500, and may be bent in the same manner as the second barrier sheet 500. The first barrier sheet 400 may be disposed between the second barrier sheet 500 and the first support member 321 and between the second barrier sheet 500 and the second support member 322. The first barrier sheet 400 may overlap the side surface of the first support member 321 and the side surface of the second support member 322 in the second direction DR2, and may also overlap the gap G between the first support member 321 and the second support member 322 in the plan view in the folded state.

Accordingly, since the first barrier sheet 400 and the second barrier sheet 500 may doubly cover the gap G between the first support member 321 and the second support member 322, the introduction of foreign matter may be prevented.

Figure 21:
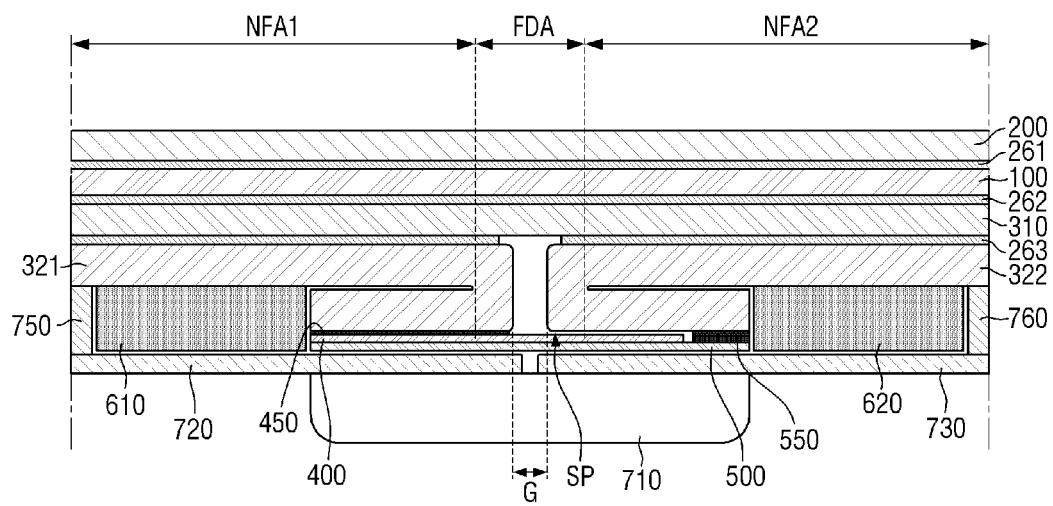
FIG. 21 is a cross-sectional view illustrating an unfolded state of a display device according to yet another embodiment.
Figure 22:
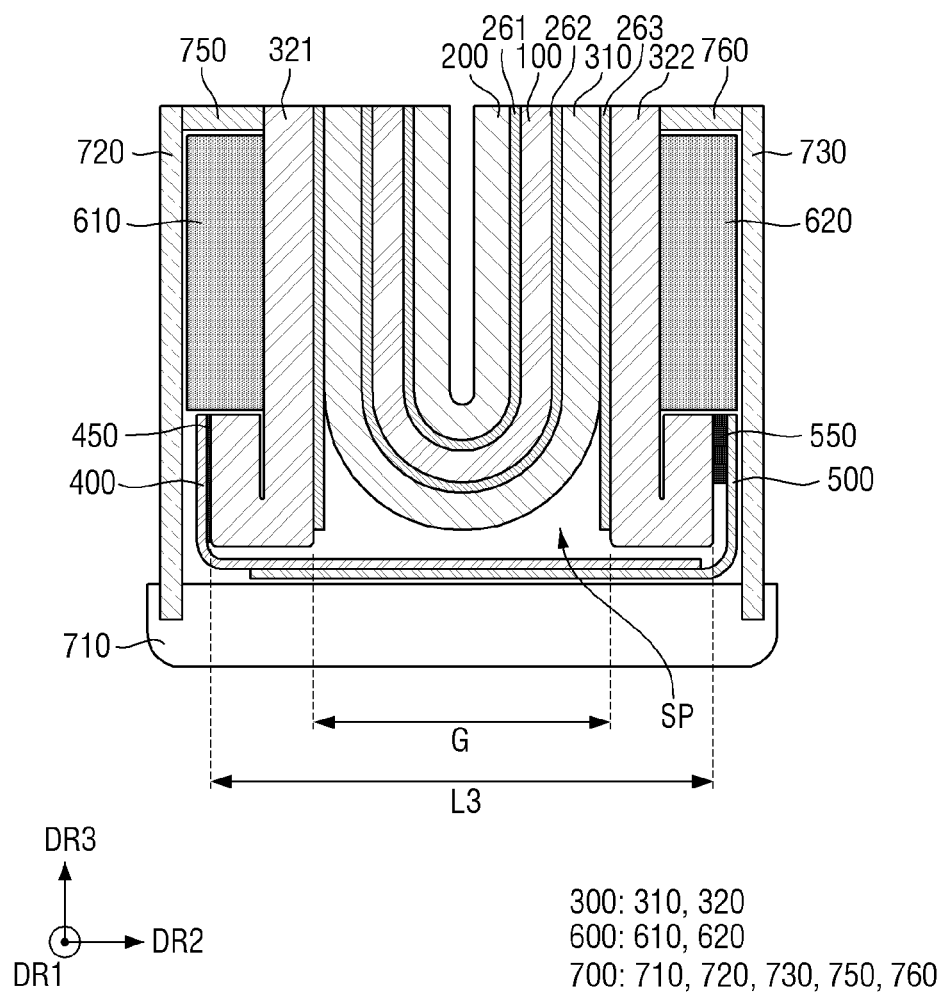
FIG. 22 is a cross-sectional view illustrating a folded state of a display device according to yet another embodiment.
Figure 23:
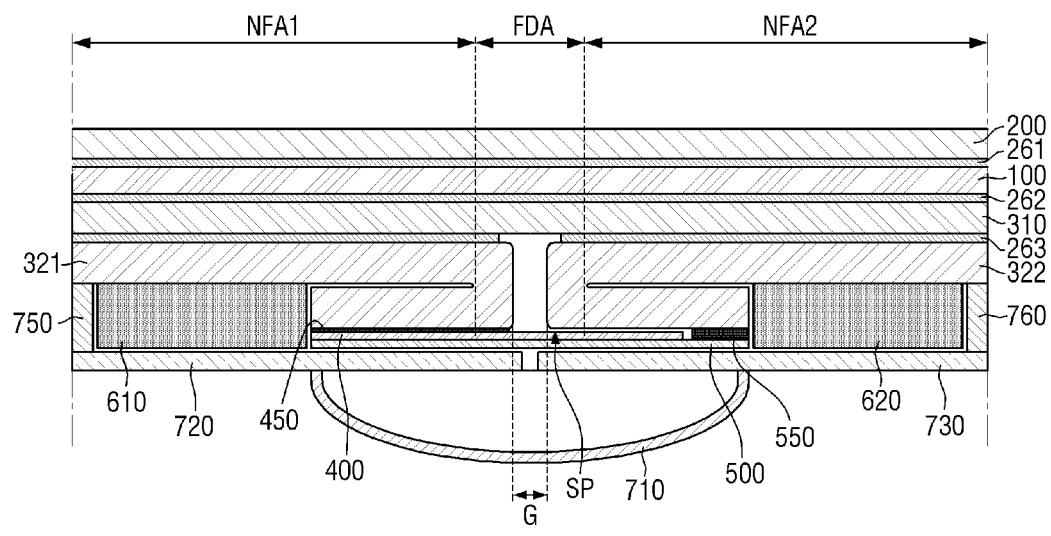
FIG. 23 is a cross-sectional view illustrating an unfolded state of a display device according to another embodiment.
Figure 24:
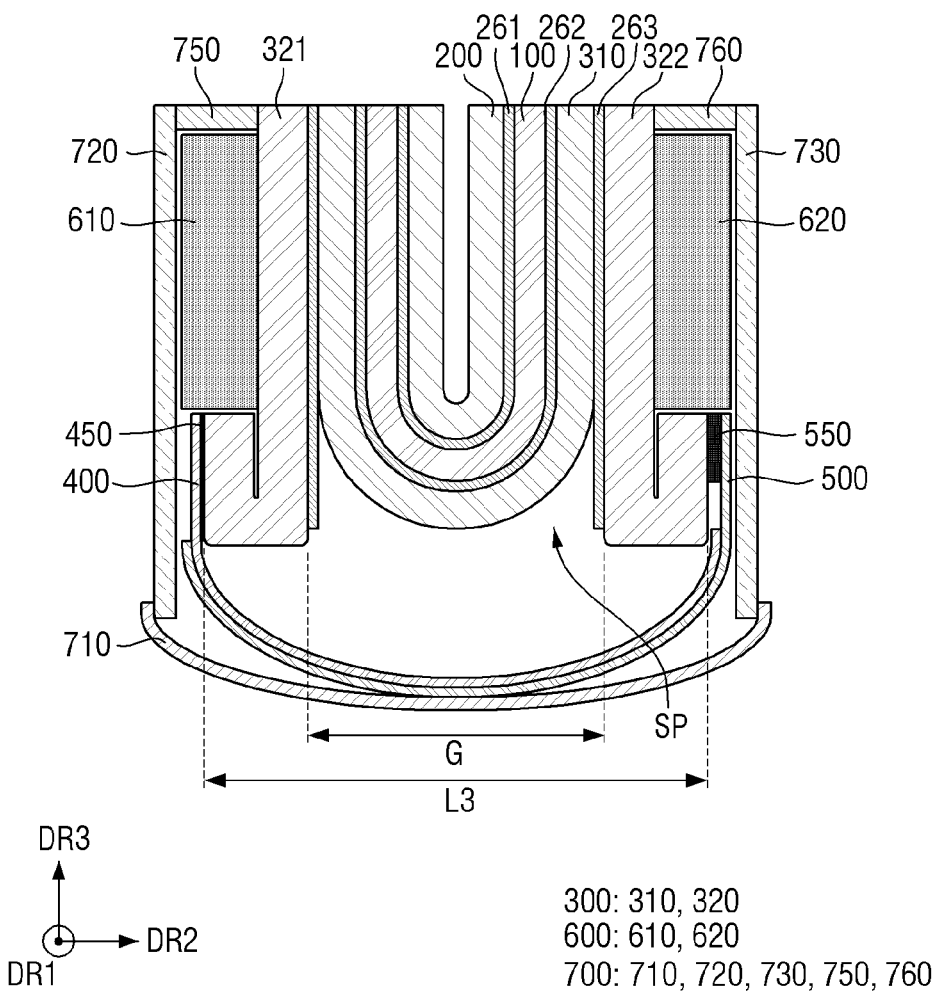
FIG. 24 is a cross-sectional view illustrating a folded state of a display device according to another embodiment.

FIG. 21 is a cross-sectional view illustrating an unfolded state of a display device according to yet another embodiment, FIG. 22 is a cross-sectional view illustrating a folded state of a display device according to yet another embodiment, FIG. 23 is a cross-sectional view illustrating an unfolded state of a display device according to another embodiment, and FIG. 24 is a cross-sectional view illustrating a folded state of a display device according to another embodiment.

Referring to FIGS. 21 and 24, the display device 10 according to the present embodiment may include a first barrier sheet 400, a second barrier sheet 500, a first support member 321, and a second support member 322. In particular, the present embodiment is different from the aforementioned embodiment of FIGS. 7 to 20 in that the shapes of the first support member 321 and the second support member 322 are different from each other. Other configurations are substantially the same or similar. Therefore, redundant descriptions are omitted, and differences will be mainly described.

Referring to FIG. 21, one side of the first support member 321 and one side of the second support member 322 may be formed to have a folded structure. Specifically, one side of the first support member 321, facing the folding area FDA, may have a folded structure, that is, a hemming structure. One side of the second support member 322, facing the folding area FDA, may also have a hemming structure. When each of the first support member 321 and the second support member 322 has a hemming structure in the folding area FDA, the strength of the first support member 321 and the second support member 322 in the folding area FDA may be improved. Accordingly, the strength of the first support member 321 and the second support member 322 in the folding area FDA is improved, and the damage caused by folding and unfolding of the display device 10 may be prevented.

As one side of the first support member 321 and one side of the second support member 322 are formed to have a hemming structure, the thicknesses of one side of the first support member 321 and one side of the second support member 322 may increase. Accordingly, the thicknesses of the first heat dissipation member 610 and the first coupling member 750 disposed on the back surface of the first support member 321, and the thicknesses of the second heat dissipation member 620 and the second coupling member 760 disposed on the back surface of the second support member 322 may increase. For example, the thicknesses of the first heat dissipation member 610 and the second heat dissipation member 620 may be thicker than the thicknesses of the first support member 321 and the second support member 322. Further, the thicknesses of the first coupling member 750 and the second coupling member 760 may be thicker than the thicknesses of the first support member 321 and the second support member 322.

As shown in FIG. 22, when the display device 10 is folded, the first barrier sheet 400 and the second barrier sheet 500 may be bent substantially in the same manner as in FIG. 12. Due to the hemming structures of the first support member 321 and the second support member 322, in the folded state, the distance L3 between one side of the first support member 321 disposed in a direction opposite to the second direction DR2 and one side of the second support member 322 disposed in the second direction DR2 may increase.

Accordingly, in the present embodiment, one end of the first barrier sheet 400 not overlapping the first adhesive member 450 may overlap the second support member 322 in the third direction DR3, and may not overlap the second support member 322 in the second direction DR2. Similarly, one end of the second barrier sheet 500 not overlapping the second adhesive member 550 may overlap the first support member 321 in the third direction DR3, and may not overlap the first support member 321 in the second direction DR2.

The first barrier sheet 400 and the second barrier sheet 500 may overlap each other in the folding area FDA to cover the gap G between the first support member 321 and the second support member 322, thereby preventing the introduction of foreign matter.

As shown in 23 and 24, the hinge structure 710 may be formed in the same manner as in FIGS. 17 and 18. The hinge structure 710 may guide the second barrier sheet 500 to be bent. The hinge structure 710 may have a shape in which one surface thereof facing the second barrier sheet 500 is concavely rounded. Accordingly, when the display device 10 is folded, the second barrier sheet 500 may slide in the second direction DR2 and simultaneously bent according to the concave shape due to the concave surface of the hinge structure 710, and may maintain the bent shape. Further, the first barrier sheet 400 may be guided by the bent shape of the second barrier sheet 500 to be formed in a shape that is substantially the same as that of the second barrier sheet 500.

As described above, the display device 10 according to embodiments may be provided with the first barrier sheet 400 and the second barrier sheet 500 overlapping each other, but the first barrier sheet 400 and the second barrier sheet 500 may slide in different directions from each other, so that the gap G between the first support member 321 and the second support member 322 may be doubly covered, thereby preventing the introduction of foreign matter.

According to a display device according to embodiments, a first barrier sheet and a second barrier sheet, facing each other, are provided, and the first barrier sheet and the second barrier sheet slide in different directions from each other in a folded state, so that a gap between a first supper member and a second support member may be doubly covered, thereby preventing the introduction of foreign matter.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device, comprising:
    a display panel including a folding area, a first unfolding area and a second unfolding area, wherein the first and second unfolding areas are adjacent to each other with the folding area therebetween and arranged in a first direction in a plan view in an unfolding state of the display device;
    a first support member and a second support member disposed on a back surface of the display panel and spaced apart from each other with the folding area therebetween;
    a first barrier sheet at least partially fixed to a back surface of the first support member and extending to a back surface of the second support member; and
    a second barrier sheet at least partially fixed to the back surface of the second support member, extending to the back surface of the first support member, and covering the first barrier sheet,
    wherein each of the first barrier sheet and the second barrier sheet overlaps the first support member, the folding area, and the second support member in the plan view in the unfolding state, and
    the first barrier sheet is accommodated in a space between the second barrier sheet and the second support member.

2. The display device of claim 1,
    wherein the first support member overlaps the first unfolding area, and the second support member overlaps the second unfolding area.

3. The display device of claim 1, further comprising:
    a first adhesive member disposed between the first support member and the first barrier sheet; and
    second adhesive members disposed between the second support member and the second barrier sheet,
    wherein the first adhesive member is disposed on a front surface of the first barrier sheet to attach the first support member and the first barrier sheet, and the second adhesive members are disposed on at least both corners of the second barrier sheet to attach the second support member and the second barrier sheet.

4. The display device of claim 3,
    wherein the second adhesive member is thicker than the first adhesive member in a thickness direction different from the first direction.

5. The display device of claim 1,
    wherein the second barrier sheet overlaps entirety of the first barrier sheet in the plan view in the unfolding state, and the first barrier sheet is disposed in a space between the first support member and the second barrier sheet and between the second support member and the second barrier sheet.

6. The display device of claim 5,
    wherein the first barrier sheet includes a first barrier area overlapping the first support member, the folding area, and the second support member, and a second barrier area overlapping the second support member and not overlapping the first support member and the folding area in the plan view in the unfolding state.

7. The display device of claim 6,
    wherein a width of the first barrier area is greater than a width of the second barrier area in a second direction crossing the first direction, and the second barrier area is disposed between second adhesive members.

8. The display device of claim 1,
    wherein the second barrier sheet covers and overlaps entirety of the first barrier sheet, and has a greater planar area than the first barrier sheet in the plan view in the unfolding state.

9. The display device of claim 1,
    wherein a maximum length of the second barrier sheet is greater than or equal to a maximum length of the first barrier sheet in the first direction.

10. The display device of claim 1,
    wherein the second barrier sheet overlaps a portion of the first barrier sheet, and does not overlap a remaining portion of the first barrier sheet.

11. The display device of claim 10, further comprising:
    a third barrier sheet disposed in an area of a back surface of the first barrier sheet, not overlapping the second barrier sheet, and spaced apart from the second barrier sheet in the plan view in the unfolding state,
    wherein the third barrier sheet and the second barrier sheet are disposed on a same plane.

12. The display device of claim 11,
    wherein the third barrier sheet is attached to the back surface of the first barrier sheet through a third adhesive member disposed in an area of the back surface of the first barrier sheet, not overlapping the second barrier sheet in the plan view in the unfolding state.

13. The display device of claim 11,
    wherein a gap between the third barrier sheet and the second barrier sheet does not overlap the folding area in the plan view in the unfolding state.

14. The display device of claim 13,
    wherein the gap between the third barrier sheet and the second barrier sheet overlaps the first support member, and does not overlaps the second support member in the plan view in the unfolding state.

15. The display device of claim 1,
    wherein one side of the first support member and one side of the second support member, which are adjacent to the folding area, face each other and have a hemming structure.

16. The display device of claim 1, further comprising:
    a connection unit disposed behind the second barrier sheet,
    wherein the connection unit includes a first hinge bracket overlapping the first support member, a second hinge bracket overlapping the second support member, and a hinge structure coupling the first hinge bracket and the second hinge bracket, and
    the hinge structure overlaps the first barrier sheet and the second barrier sheet in the plan view in the unfolding state.

17. A display device, comprising:
a display panel including a folding area, a first unfolding area and a second unfolding area, wherein the first and second unfolding areas are adjacent to each other with the folding area therebetween;
a first support member and a second support member disposed on a back surface of the display panel and spaced apart from each other with the folding area therebetween;
a first adhesive member disposed on a back surface of the first support member and a second adhesive member disposed on a back surface of the second support member;
a first barrier sheet at least partially fixed to the first adhesive member and extending to the back surface of the second support member; and
a second barrier sheet at least partially fixed to the second adhesive member, extending to the back surface of the first support member, and covering the first barrier sheet,
wherein the first barrier sheet and the second barrier sheet overlap a gap between the first support member and the second support member, and
the first barrier sheet is disposed between the second barrier sheet and the second support member and between the second barrier sheet and the first support member.

18. The display device of claim 17, further comprising:
a hinge structure disposed behind the second barrier sheet,
wherein, when the display device is folded, the first barrier sheet and the second barrier sheet are bent according to a shape of an upper surface of the hinge structure.

19. The display device of claim 18,
wherein the upper surface of the hinge structure and the second barrier sheet at least partially contact each other, and the first barrier sheet and at least a portion of the second barrier sheet contact each other.

20. The display device of claim 17,
wherein one side of the first support member faces one side of the second adhesive member, and a length between one side of the first barrier sheet and one side of the second adhesive member in an unfolding state of the display device is shorter than and a length between one side of the first barrier sheet and one side of the second adhesive member in a folding state of the display device.

* * * * *